United States Patent
Sasaki et al.

(10) Patent No.: US 9,691,932 B2
(45) Date of Patent: Jun. 27, 2017

(54) PHOTODETECTOR

(71) Applicant: KABUSHIKI KAISHA TOSHIBA, Tokyo (JP)

(72) Inventors: Keita Sasaki, Kanagawa (JP); Risako Ueno, Tokyo (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/840,316

(22) Filed: Aug. 31, 2015

(65) Prior Publication Data

US 2016/0079464 A1 Mar. 17, 2016

(30) Foreign Application Priority Data

Sep. 16, 2014 (JP) .................................. 2014-188182

(51) Int. Cl.
  *H01L 31/0232* (2014.01)
  *H01L 31/103* (2006.01)
  *H01L 31/0216* (2014.01)
  *H01L 31/02* (2006.01)
  *H01L 31/028* (2006.01)
  *H01L 27/146* (2006.01)

(52) U.S. Cl.
  CPC ........ *H01L 31/103* (2013.01); *H01L 27/1469* (2013.01); *H01L 27/14629* (2013.01); *H01L 27/14634* (2013.01); *H01L 27/14636* (2013.01); *H01L 27/14647* (2013.01); *H01L 31/02005* (2013.01); *H01L 31/028* (2013.01); *H01L 31/02161* (2013.01); *H01L 31/02327* (2013.01)

(58) Field of Classification Search
  CPC ............ H01L 31/103; H01L 27/14634; H01L 27/14636; H01L 27/14647; H01L 27/1469; H01L 27/14629; H01L 31/02161; H01L 31/028; H01L 31/02005; H01L 31/02327
  See application file for complete search history.

(56) References Cited

U.S. PATENT DOCUMENTS

| 8,629,485 | B2 | 1/2014 | Yamamura et al. |
| 8,742,528 | B2 | 6/2014 | Yamamura et al. |
| 8,916,945 | B2 | 12/2014 | Sakamoto et al. |
| 9,209,336 | B2 * | 12/2015 | Sanfilippo ......... H01L 27/14643 |
| 9,435,686 | B2 * | 9/2016 | Nagano ................. H01L 27/144 |

(Continued)

FOREIGN PATENT DOCUMENTS

| JP | 2008-153311 | 7/2008 |
| JP | 2010-226073 | 10/2010 |

(Continued)

*Primary Examiner* — Victor A Mandala
(74) *Attorney, Agent, or Firm* — Finnegan, Henderson, Farabow, Garrett & Dunner, LLP

(57) ABSTRACT

According to a photodetector includes a first light detection layer and a reflective layer. The first light detection layer has a first surface and a second surface on a side opposite to the first surface. The first light detection layer includes a first light detection area including a p-n junction of a p-type semiconductor layer containing Si and an n-type semiconductor layer containing Si. The reflective layer arranged on a second surface side of the first light detection layer so as to be opposed to the first light detection area. The reflective layer reflects at least part of light in a near-infrared range.

9 Claims, 26 Drawing Sheets

(56) References Cited

U.S. PATENT DOCUMENTS

| | | |
|---|---|---|
| 2008/0121867 A1 | 5/2008 | Yagyu et al. |
| 2008/0135963 A1* | 6/2008 | Akiyama .......... H01L 27/14603 |
| | | 257/432 |
| 2008/0191240 A1 | 8/2008 | Yagyu et al. |
| 2011/0180688 A1 | 7/2011 | Nakahara |
| 2011/0298076 A1 | 12/2011 | Yamamura et al. |
| 2012/0061785 A1 | 3/2012 | Ishikawa et al. |
| 2013/0001651 A1 | 1/2013 | Mase et al. |
| 2013/0187251 A1 | 7/2013 | Yamamura et al. |
| 2014/0061835 A1 | 3/2014 | Sakamoto et al. |
| 2014/0110808 A1 | 4/2014 | Yamamura et al. |
| 2015/0340391 A1* | 11/2015 | Webster ............ H01L 27/14605 |
| | | 348/322 |

FOREIGN PATENT DOCUMENTS

| | | |
|---|---|---|
| JP | 2010-226074 | 10/2010 |
| JP | 2010-283223 | 12/2010 |
| JP | 2011-14856 | 1/2011 |
| JP | 2011-151271 | 8/2011 |
| JP | 2011-222893 | 11/2011 |
| JP | 5045436 | 10/2012 |
| JP | 5183471 | 1/2013 |
| JP | 2013-65911 | 4/2013 |
| JP | 2013-093609 | 5/2013 |
| WO | WO 2006/046276 | 5/2006 |

\* cited by examiner

PHOTODETECTOR

CROSS-REFERENCE TO RELATED APPLICATION

This application is based upon and claims the benefit of priority from Japanese Patent Application No. 2014-188182, filed on Sep. 16, 2014; the entire contents of which are incorporated herein by reference.

FIELD

Embodiments described herein relate generally to a photodetector.

BACKGROUND

Photodetectors having light detecting elements that detect light are known. Technologies for increasing the thickness of depletion layers and technologies for forming irregularities in at least areas of a silicon substrate opposed to p-n junctions have been disclosed as technologies for increasing sensitivity of a photodetector to light in the near-infrared range.

When the thickness of depletion layers is increased, drive voltage needs to be made higher. Furthermore, when the thickness of depletion layers is increased, array miniaturization of light detection elements becomes difficult. Furthermore, a dedicated processing apparatus is necessary for forming irregularities on a silicon substrate. Thus, in related art, it is difficult to improve the sensitivity to light in the near-infrared range with a simple structure.

DETAILED DESCRIPTION

According to a photodetector includes a first light detection layer and a reflective layer. The first light detection layer has a first surface and a second surface on a side opposite to the first surface. The first light detection layer includes a first light detection area including a p-n junction of a p-type semiconductor layer containing Si and an n-type semiconductor layer containing Si. The reflective layer arranged on a second surface side of the first light detection layer so as to be opposed to the first light detection area. The reflective layer reflects at least part of light in a near-infrared range.

Embodiments will be described in detail below with reference to the accompanying drawings.

First Embodiment

Figure 1:
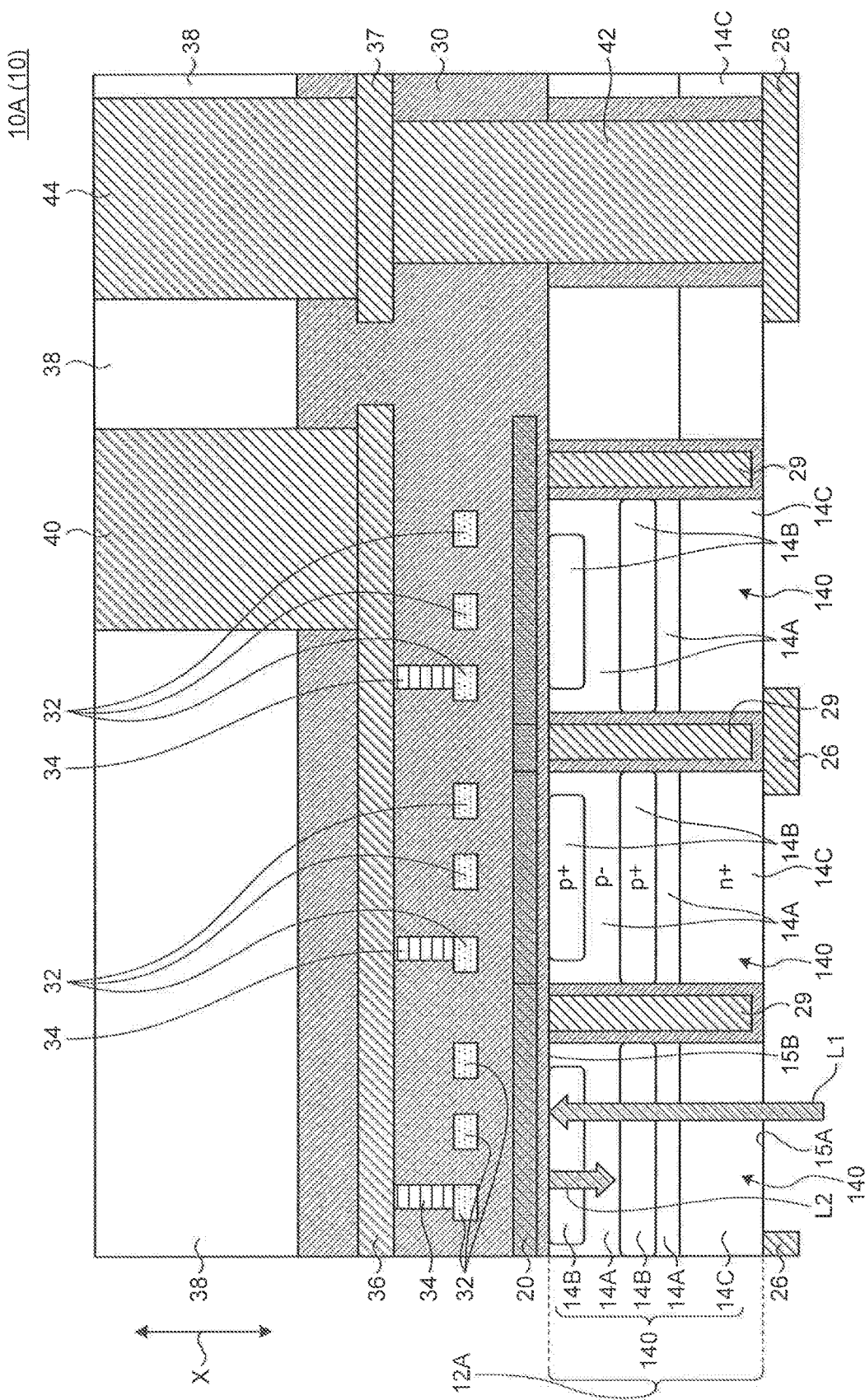
FIG. 1 is a diagram illustrating an example of a photodetector.

FIG. 1 is a diagram illustrating an example of a photodetector 10A.

The photodetector 10A includes a first light detection layer 12A, and a reflective layer 20.

The first light detection layer 12A includes multiple first light detection areas 140. The first light detection areas 140 detect incident light. The first light detection areas 140 are areas each including a p-n junction of a p-type semiconductor layer containing Si as a main component and an n-type semiconductor layer containing Si as a main component, and functioning as a photodiode.

The present embodiment describes, in one example, a case in which each of the first light detection areas 140 is an avalanche photodiode (APD) that is a p-n diode formed by alternately stacking p– type semiconductor layers 14A and p+ type semiconductor layers 14B on an n-type semiconductor substrate 14C. The first light detection areas 140 are driven in a Geiger mode, for example. Note that the first light detection areas 140 may be any area having a function of detecting light, and are not limited to APDs.

In each of the first light detection areas 140, a p-n junction is formed by an n-type region (the n-type semiconductor substrate 14C) and a p-type region (the p– type semiconductor layer 14A in FIG. 1) adjacent to the n-type region. The first light detection areas 140 are formed according to a known technology such as ion implantation, diffusion, or the like. The n-type semiconductor substrate 14C (the n-type semiconductor layer) and the –p type semiconductor layers 14A are layers containing silicon as a main component. The n-type semiconductor substrate 14C (the n-type semiconductor layer) and the −p type semiconductor layers 14A are produced by epitaxial growth of silicon or introducing dopants into a silicon substrate, for example.

The first light detection areas 140 have a first surface 15A on which light is incident and a second surface 15B opposite to the first surface 15A. The first surface 15A is one of both end surfaces of the first light detection areas 140 in the thickness direction. The first surface 15A is a surface of the first light detection areas 140 on the side on which light is incident. The second surface 15B is the other of the end surfaces of the first light detection areas 140 in the thickness direction. The second surface 15B is a surface of the first light detection layer 12A on the side from which light exits. Note that the thickness direction of the first light detection areas 140 coincides with an opposing direction (see the direction of an arrow X in FIG. 1) in which the first surface ISA and the second surface 15B are opposed to each other.

In the present embodiment, the first surface 15A of the photodetector 10A is the surface of the first light detection areas 140 on the n-type semiconductor substrate 14C side of the p-n junctions. On the other hand, the second surface 15B thereof is the surface of the first light detection areas 140 on the p-type semiconductor layer (the p− type semiconductor layers 14A and the p+ type semiconductor layers 14B) side of the p-n junctions.

Alternatively, the first surface 15A may be the surface of the first light detection areas 140 on the p-type semiconductor layer (the p− type semiconductor layers 14A and the p+ type semiconductor layers 14B) side of the p-n junctions.

The first light detection layer 12A has multiple first light detection areas 140 arranged in a matrix, for example, along a plane intersecting with the aforementioned opposing direction. The first light detection layer 12A has pixel areas arranged in a matrix, in which multiple first light detection areas 140 are one pixel, for example.

In the first light detection layer 12A, element isolation regions 29 are provided in regions between the first light detection areas 140. The element isolation regions 29 suppress electrical interference between adjacent first light detection areas 140.

An insulating layer 30 and a support substrate 38 are stacked in this order on the first light detection layer 12A. The insulating layer 30 is a layer made of an insulating material. The support substrate 38 is a substrate that supports the first light detection layer 12A. The support substrate 38 is made of silicon, glass, or sapphire, for example.

The insulating layer 30 is provided with the reflective layer 20, quenching resistors 32, contact layers 34, and a wiring layer 36 in this order from the first light detection layer 12A side.

The reflective layer 20 is provided on the second surface 15B side of the first light detection areas 140. The reflective layer 20 reflects at least part of light in the near-infrared range. At least part of light in the near-infrared range refers to light having wavelengths in at least a certain range of wavelengths in the near-infrared range.

Light in the near-infrared range refers to light in a wavelength range of 780 nm or longer and 2500 nm or shorter. The reflective layer 20 preferably at least reflects light in a wavelength range of 780 nm or larger and 1100 nm or shorter.

The thickness, the materials, and the like of the reflective layer 20 are adjusted in advance so that reflection that makes at least part of light in the near-infrared range contained in light incident on the first surface 15A of the first light detection layer 12A (see incident light L1 in FIG. 1) at least reach depletion layers in the first light detection areas 140.

For example, the thickness of the reflective layer 20 may be adjusted as appropriate so that the reflection condition is met according to the structure of the first light detection areas 140, the material of the reflective layer 20, the position of the reflective layer 20 relative to that of the first light detection layer 12A in the opposing direction (the direction of the arrow X), and the like.

The reflective layer 20 is made of materials that can reflect at least part of light in the near-infrared range. Specifically, reflective layer 20 is made of metal such as Al, Ti, TiN, W, or Mo that is typically used in semiconductor processes and an alloy material thereof.

A region between the first light detection areas 140 and the reflective layer 20 in the opposing direction of the photodetector 10A is preferably made of a material that transmits at least part of light in the near-infrared range.

The reflective layer 20 may be provided in such a manner as to cover at least part of the second surface 15B of the first light detection areas 140 along a perpendicular direction that is perpendicular to the opposing direction. Alternatively, the reflective layer 20 may be provided in such a manner as to cover the entire area of the first light detection areas 140 on the second surface 15B side along the perpendicular direction (the direction perpendicular to the direction of the arrow X in FIG. 1) that is perpendicular to the opposing direction. Alternatively, as illustrated in FIG. 1, the reflective layer 20 may be provided in such a manner to cover the first light detection areas 140 on the second surface 15B side in the first light detection layer 12A continuously along the perpendicular direction.

The position of the reflective layer 20 in the opposing direction (the direction of the arrow X) of the photodetector 10A may be any position on the second surface 15B side of the first light detection areas 140, but is preferably between the first light detection layer 12A and the quenching resistors 32.

The quenching resistors 32 are connected in series with the first light detection areas 140. Polysilicon, for example, is used for the quenching resistors 32.

The quenching resistors 32 are in passages of charge amplified at the p-n junctions of the first light detection areas 140. Thus, the quenching resistors 32 limit the amounts of current flowing through the first light detection areas 140. For example, when one photon enters a first light detection area 140 and Geiger discharge occurs therein, amplification is terminated as a result of voltage drop caused by the quenching resistors 32. As a result, a pulsed output signal is obtained from the first light detection area 140.

The wiring layer 36 and a via electrode 40 are connected to the quenching resistors 32 via the contact layers 34. The wiring layer 36 functions as an anode electrode.

In the example illustrated in FIG. 1, the reflective layer 20 is provided between the quenching resistors 32/contact layers 34/wiring layer 36 and the first light detection areas 140 in the opposing direction (see the direction of the arrow X in FIG. 1). Alternatively, the reflective layer 20 may be provided between at least one of the wiring layer 36, the contact layers 34, and the quenching resistors 32 and the first light detection layer 12A.

Provision of the reflective layer 20 between the first light detection layer 12A and the quenching resistors 32 in the opposing direction can improve the flexibility of the wiring and the layout of the quenching resistors 32, the contact layers 34 connected to the quenching resistors 32, the wiring layer 36, and the like. The increased flexibility in the layout of the quenching resistors can lower the sheet resistance of the quenching resistors and reduce the variation in resistance caused by variation in processing.

Furthermore, provision of the reflective layer 20 between the first light detection layer 12A and the quenching resistors 32/contact layers 34/wiring layer 36 in the opposing direction can further improve the flexibility in the wiring layout. The improved flexibility in the wiring layout can thus reduce wiring resistance and reduce parasitic capacitance.

On the surface of the first light detection layer 12A opposite to the wiring layer 36, an electrode layer 26 is provided. In the photodetector 10A, the electrode layer 26 functions as a cathode electrode. The electrode layer 26 is connected to a via electrode 44 via a via electrode 42 and an electrode layer 37.

Thus, the first light detection layer 12A including the first light detection areas 140, the quenching resistors 32, the contact layers 34, the wiring layer 36, and the electrode layer 26 function as silicon photomultipliers (SiPM).

In the present embodiment, the electrode layer 26 is provided on the first surface 15A side of the first light detection areas 140. Thus, at least a region of the electrode layer 26 overlapping with the first light detection areas 140 is preferably a transparent electrode that transmits at least part of light in the wavelength range to which the first light detection areas 140 are sensitive.

Light (see incident light L1 in FIG. 1) incident on the first surface 15A of the photodetector 10A having the structure as described above enters the first light detection areas 140. Light entering the first light detection areas 140 is reflected by the reflective layer 20 toward the first light detection areas 140 (see reflected light L2 in FIG. 1).

A reverse bias drive voltage equal to or higher than avalanche breakdown voltage, for example, is applied to the p-n junctions of the first light detection areas 140 between the wiring layer 36 and the electrode layer 26 under the control of a signal processing circuit, which is not illustrated. When light enters the first light detection areas 140 from the first surface 15A in this state, a pulsed current flows through the first light detection areas 140 in the reverse bias direction. This current is then output as an electric signal to the signal processing circuit, which is not illustrated. The photodetector 10A detects light in this manner.

As described above, the photodetector 10A of the present embodiment includes the first light detection layer 12A and the reflective layer 20. The first light detection layer 12A includes the first light detection areas 140. The first light detection areas 140 have the first surface 15A on which light is incident and the second surface 15B opposite to the first surface 15A, and each include the p-n junction of the p-type semiconductor layer containing Si as a main component and the n-type semiconductor layer containing Si as a main component. The reflective layer 20 is provided on the first surface 15A side of the first light detection areas 140, and reflects at least part of light in the near-infrared range.

It is known that the spectral sensitivity in the near-infrared range of the photodetector 10 is lower as the thickness of the depletion layers in the first light detection areas 140 is smaller. For example, the thickness of the depletion layers in the first light detection areas 140 is typically 2 to 3 μm when first light detection areas 140 are APDs in which Si is used for the semiconductor substrate. The reverse bias voltage that is a drive voltage is typically 100 V or lower. The spectral sensitivity in the near-infrared range of the first light detection areas 140 having the aforementioned thickness is lower than 10%. Furthermore, for absorption of 90% of near-infrared light at 850 nm, for example, the thickness of the depletion layers needs to be several tens of μm or larger (30 μm or larger, for example).

As the thickness of the depletion layers is larger, the drive voltage needs to be higher. When the thickness of the depletion layer is several tens of pun or larger, for example, the drive voltage needs to be several hundreds of V or higher. In addition, as the thickness of the depletion layers is larger, array miniaturization is more difficult.

In contrast, the photodetector 10A of the present embodiment includes the reflective layer 20 that reflect at least part of light in the near-infrared range on the second surface 15B side of the first light detection areas 140.

Thus, in the photodetector 10A of the present embodiment, the reflected light L2 resulting from reflection of the incident light L1 having passed through the first light detection areas 140 by the reflective layer 20 reaches the first light detection areas 140 again.

With the reflection of light by the reflective layer 20, the light path length of the light entering the first light detection areas 140 in the first light detection areas 140 can be made longer than that in a structure without the reflective layer 20.

The photodetector 10A of the present embodiment can therefore have improved sensitivity to light in the near-infrared range.

Furthermore, the photodetector 10A of the present embodiment can have improved sensitivity to light in the near-infrared range in the photodetector 10A without adjusting the thickness and the drive voltage of the first light detection areas 140 (specifically, the depletion layers). Furthermore, the photodetector 10A of the present embodiment can have improved sensitivity to light in the near-infrared range without increasing the chip size of the photodetector 10A and while maintaining response characteristics.

In addition, in the photodetector 10A, since the quenching resistors 32 and the contact layers 34 are not disposed on the first surface 25A side of the first light detection layer 12A, the aperture ration of the first light detection areas 140 in the first light detection layer 12A can be made larger than that in a case where the present structure is not used.

Second Embodiment

In the present embodiment, an embodiment in which the reflective layer 20 is disposed at a position different from that in the first embodiment will be described.

Figure 2:
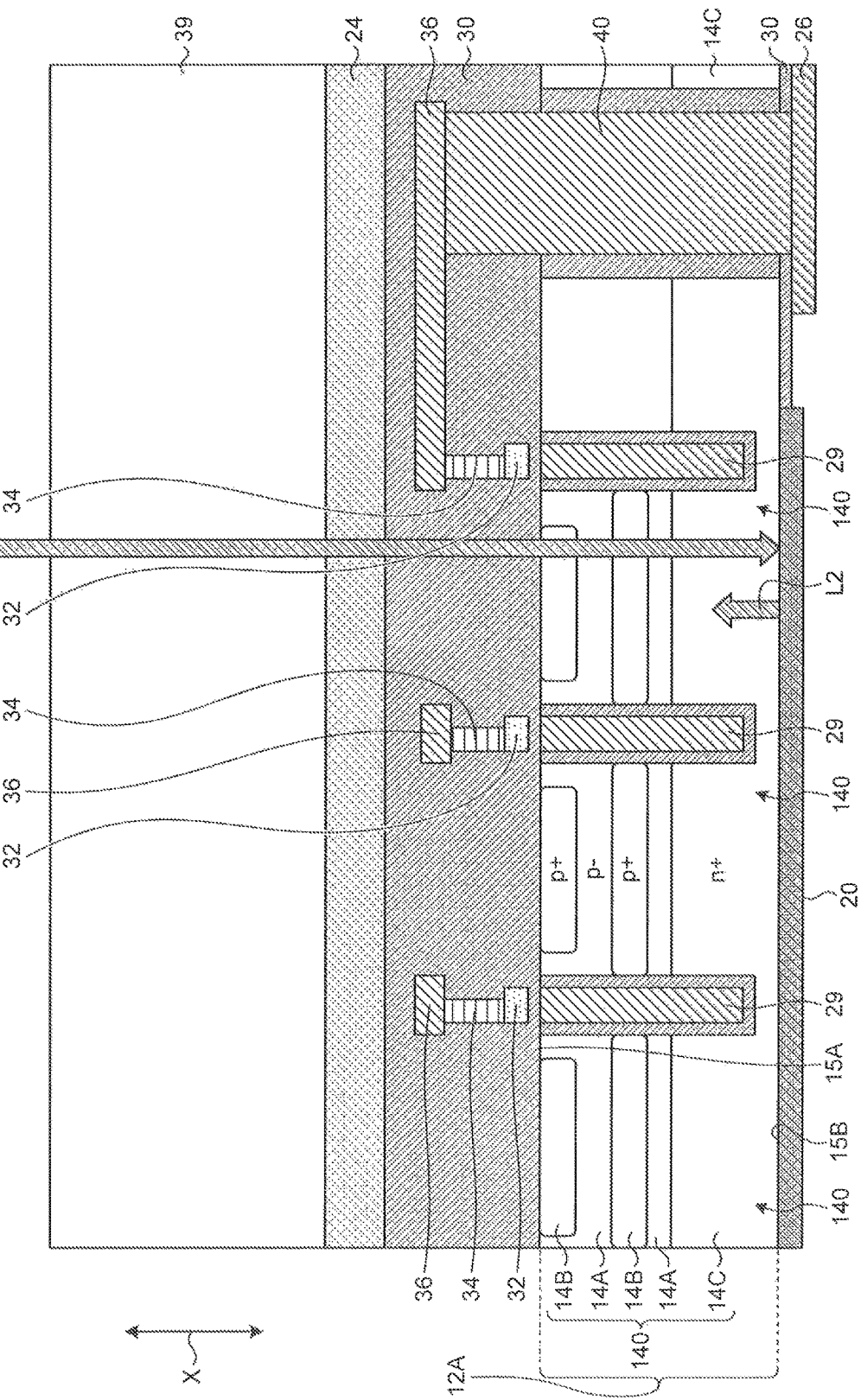
FIG. 2 is a diagram illustrating an example of a photodetector.

FIG. 2 as a diagram illustrating an example of a photodetector 10B.

The photodetector 10B includes a first light detection layer 12A and a reflective layer 20.

The first light detection layer 12A is the same as that in the first embodiment. Specifically, the first light detection layer 12A includes multiple first light detection areas 140. The first light detection areas 140 each have a structure in which p− type semiconductor layers 14A and p+ type semiconductor layers 14B are stacked alternately on an n-type semiconductor substrate 14C. In addition, in each of the first light detection areas 140, a p-n junction is formed by an n-type region (the n-type semiconductor substrate 14C) and a p-type region (the p− type semiconductor layer 14A) adjacent to the n-type region.

In the first light detection layer 12A, element isolation regions 29 are provided in regions between the first light detection areas 140. Element isolation regions 29 are the same as those in the first embodiment.

The first light detection areas 140 have a first surface 15A on which light is incident and a second surface 15B opposite to the first surface 15A. In the present embodiment, the second surface 15B is the surface of the first light detection areas 140 on the n-type semiconductor substrate 14C side of the p-n junctions. Furthermore, in the present embodiment, the first surface 15A is the surface of the first light detection areas 140 on the p-type semiconductor layer (the p− type semiconductor layers 14A and the p+ type semiconductor layers 14B) side of the p-n junctions.

An insulating layer 30, an adhesive layer 24, and a support substrate 39 are stacked in this order on the first light detection layer 12A.

The insulating layer 30 is provided with quenching resistors 32, contact layers 34, and a wiring layer 36 in this order from the first light detection layer 12A side. The insulating layer 30 is the same as that in the first embodiment except that the reflective layer 20 is not provided.

More specifically, the insulating layer 30 is provided with the quenching resistors 32 connected in series with the first light detection areas 140. Furthermore, the insulating layer 30 is provided with the wiring layer 36 connected to the quenching resistors 32 via the quenching resistors 32 and the contact layers 34. The wiring layer 36 is connected to an electrode layer 26 via a via electrode 40. In the present embodiment, the wiring layer 36 and the electrode layer 26 function as an anode electrode.

The support substrate 39 is made of a material that transmits at least part of light in the wavelength range to which the first light detection areas 140 are sensitive. The adhesive layer 24 adheres the support substrate 39 and the insulating layer 30 to each other. The adhesive layer 24 is also made of a material that transmits at least part of light in the wavelength range to which the first light detection areas 140 are sensitive.

Furthermore, at least regions of the insulating layer 30, the wiring layer 36, the contact layers 34, and the quenching resistors 32 that overlap with the respective first light detection areas 140 are made of a material that transmits at least part of light in the wavelength range to which the first light detection areas 140 are sensitive.

The reflective layer 20 is provided on the second surface 15B side of the first light detection areas 140. As described above, in the present embodiment, the second surface 15B of the photodetector 10B is the surface of the first light detection areas 140 on the n-type semiconductor substrate 14C side of the p-n junctions. Furthermore, in the present embodiment, the first surface 15A is the surface of the first light detection areas 140 on the p-type semiconductor layer (the p− type semiconductor layers 14A and the p+ type semiconductor layers 14B) of the p-n junctions. Thus, in the present embodiment, the reflective layer 20 is provided on the second surface 15B side of the first light detection areas 140, that is, the n-type semiconductor substrate 14C side of the p-n junctions.

In other words, in the present embodiment, the position of the reflective layer 20 in the photodetector 10B in the opposing direction (see the direction of an arrow X in FIG. 2) is on the second surface 15B side of the first light detection areas 140, that is, on the side opposite to the quenching resistors 32 with respect to the first light detection areas 140.

The material and the thickness of the reflective layer 20 are the same as those in the first embodiment.

Note that, in the present embodiment, the reflective layer 20 has a reflection characteristic that reflects at least part of light in the near-infrared range and is also conductive. Thus, in the present embodiment, the reflective layer 20 functions as a cathode electrode.

Alternatively, another electrode layer may be provided on the reflective layer 20 and this electrode layer may be used as a cathode electrode. In this case, the reflective layer 20 may be non-conductive. When the reflective layer 20 is not to function as an electrode or a resistor in this manner, voltage is not applied to the reflective layer 20.

When an electrode layer to be used as a cathode electrode is stacked on the reflective layer 20, the electrode layer is configured to have the following characteristics. Specifically, when the electrode layer (the cathode electrode) is provided between the reflective layer 20 and the first light detection areas 140, the electrode layer may be a transparent electrode that transmits at least part of light in the near-infrared range. In contrast, when the electrode layer (the cathode electrode) is provided on the reflective layer 20 side opposite to the first light detection areas 140, the electrode layer may be any conductive layer and is not limited to a transparent electrode.

Light (see incident light L1 in FIG. 2) incident on the first surface 15A of the photodetector 10B of the present embodiment enters the first light detection areas 140. Light entering the first light detection areas 140 is reflected by the reflective layer 20 toward the first light detection areas 140 (see reflected light L2 in FIG. 2).

Thus, the reflected light L2 resulting from reflection of the incident light L1 having passed through the first light detection areas 140 by the reflective layer 20 reaches the first light detection areas 140 again. With the reflection of light by the reflective layer 20, the light path length of the light entering the first light detection areas 140 in the first light detection areas 140 can be made longer than that in a structure without the reflective layer 20.

A reverse bias drive voltage equal to or higher than avalanche breakdown voltage, for example, is applied to the p-n junctions of the first light detection areas 140 between the wiring layer 36 and the reflective layer 20 (the cathode electrode) under the control of a signal processing circuit, which is not illustrated. When light is incident on the first surface 15A in this state, a pulsed current flows through the first light detection areas 140 in the reverse bias direction. This current is then output as an electric signal to the signal processing circuit, which is not illustrated. The photodetector 10B detects light in this manner.

As described above, the photodetector 10B of the present embodiment includes the first light detection layer 12A and the reflective layer 20. The first light detection layer 12A includes the first light detection areas 140. In the present embodiment, the second surface 15B is the surface of the first light detection areas 140 on the n-type semiconductor substrate 14C side of the p-n junctions. Furthermore, in the present embodiment, the first surface 15A is the surface of the first light detection areas 140 on the p-type semiconductor layer (the p− type semiconductor layers 14A and the p+ type semiconductor layers 143) side of the p-n junctions.

The reflective layer 20 is disposed on the second surface 15B side of the first light detection areas 140. In other words, the reflective layer 20 is disposed on the side opposite to the quenching resistors 32 with respect to the first light detection areas 140.

In a case where the reflective layer 20 is disposed on the side opposite to the quenching resistors 32 with respect to the first light detection areas 140 in this manner, the photodetector 10B can also produce the same effects as those in the first embodiment as a result of disposing the reflective layer 20 on the second surface 15B side of the first light detection areas 140.

Furthermore, disposition of the reflective layer 20 on the side opposite to the quenching resistors 32 with respect to the first light detection areas 140, the flexibility in the wiring layout of the quenching resistors 32, the contact layers 34, the wiring layer 36, and the like can be improved.

Third Embodiment

In the first embodiment, a case in which the reflective layer 20 is separate from the wiring layer 36 has been described.

In the present embodiment, a case in which the reflective layer 20 functions as part of the wiring layer 36 will be described.

Figure 3:
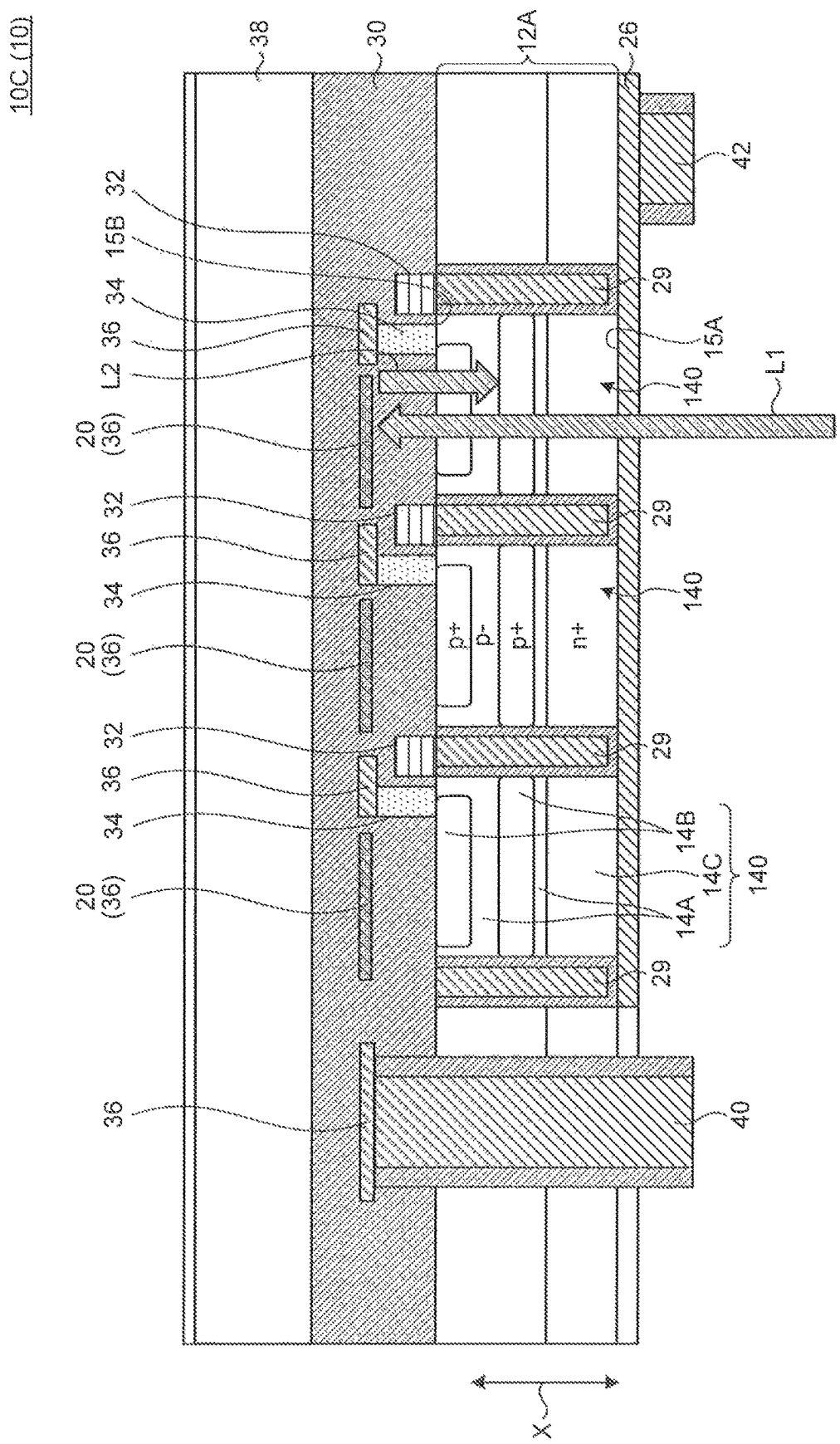
FIG. 3 is a diagram illustrating an example of a photodetector.

FIG. 3 is a diagram illustrating an example of a photodetector 10C.

The photodetector 10C includes a first light detection layer 12A and a reflective layer 20.

The first light detection layer 12A is the same as that in the first embodiment. Specifically, the first light detection layer 12A includes multiple first light detection areas 140. The first light detection areas 140 each have a structure in which p− type semiconductor layers 14A and p+ type semiconductor layers 14B are stacked alternately on an n-type semiconductor substrate 14C. In addition, in each of the first light detection areas 140, a p-n junction is formed by an n-type region (the n-type semiconductor substrate 14C) and a p-type region (the p− type semiconductor layer 14A) adjacent to the n-type region.

In the first light detection layer 12A, element isolation regions 29 are provided in regions between the first light detection areas 140. Element isolation regions 29 are the same as those in the first embodiment.

The first light detection areas 140 have a first surface 15A on which light is incident and a second surface 15B opposite to the first surface 15A. In the present embodiment, similarly to the first embodiment, the first surface 15A is the surface of the first light detection areas 140 on the n-type semiconductor substrate 14C side of the p-n junctions. Furthermore, in the present embodiment, the second surface 15B is the surface of the first light detection areas 140 on the p-type semiconductor layer (the p− type semiconductor layers 14A and the p+ type semiconductor layers 14B) side of the p-n junctions.

An insulating layer 30 and a support substrate 38 are stacked in this order on the first light detection layer 12A.

The insulating layer 30 is provided with quenching resistors 32 connected in series with the first light detection areas 140. Furthermore, the insulating layer 30 is provided with the wiring layer 36 connected to the quenching resistors 32 via the quenching resistors 32 and the contact layers 34. The wiring layer 36 is connected to a via electrode 40. In the present embodiment, the wiring layer 36 and the via electrode 40 function as an anode electrode.

The support substrate 38 is the same as that in the first embodiment.

The reflective layer 20 is provided on the second surface 15B side of the first light detection areas 140. The material and the thickness of the reflective layer 20 are the same as those in the first embodiment. In the present embodiment, the reflective layer 20 functions as part of the wiring layer 36. Thus, in the present embodiment, the reflective layer 20 is further conductive.

Specifically, the material of an overlapping region of the wiring layer 36 overlapping with the first light detection areas 140 may be adjusted so that the overlapping region has a reflection characteristic that reflects at least part of light in the near-infrared range. Alternatively, the entire wiring layer 36 may have a reflection characteristic that reflects at least part of light in the near-infrared range.

An electrode layer 26 is provided on the side opposite to the quenching resistors 32 of the first light detection areas 140. In the present embodiment, the electrode layer 26 is a transparent electrode that transmits at least part of light in the wavelength range to which the first light detection areas 140 are sensitive. The electrode layer 26 is connected to a via electrode 42. In the present embodiment, the electrode layer 26 functions as a cathode electrode.

Light (see incident light L1 in FIG. 3) incident on the first surface 15A of the photodetector 10C of the present embodiment enters the first light detection areas 140. Light entering the first light detection areas 140 is reflected by the reflective layer 20 toward the first light detection areas 140 (see reflected light L2 in FIG. 3).

Thus, the reflected light L2 resulting from reflection of the incident light L1 having passed through the first light detection areas 140 by the reflective layer 20 reaches the first light detection areas 140 again. With the reflection of light by the reflective layer 20, the light path length of the light entering the first light detection areas 140 in the first light detection areas 140 can be made longer than that in a structure without the reflective layer 20.

A reverse bias drive voltage equal to or higher than avalanche breakdown voltage, for example, is applied to the p-n junctions of the first light detection areas 140 between the wiring layer 36/the reflective layer 20 (the anode electrode) and the electrode layer 26 (the cathode electrode) under the control of a signal processing circuit, which is not illustrated. When light is incident on the first surface 15A in this state, a pulsed current flows through the first light detection areas 140 in the reverse bias direction. This current is then output as an electric signal to the signal processing circuit, which is not illustrated. The photodetector 10C detects light in this manner.

As described above, the photodetector 10C of the present embodiment includes the first light detection layer 12A and the reflective layer 20. The first light detection layer 12A includes the first light detection areas 140. In the present embodiment, the first surface 15A is the surface of the first light detection areas 140 on the n-type semiconductor substrate (the n-type semiconductor substrate 14C) side of the p-n junctions. Furthermore, in the present embodiment, the second surface 15B is the surface of the first light detection areas 140 on the p-type semiconductor layer (the p− type semiconductor layers 14A and the p+ type semiconductor layers 14B) of the p-n junctions.

The reflective layer 20 is disposed on the second surface 15B side of the first light detection areas 140. In the present embodiment, the reflective layer 20 is disposed as part of the wiring layer 36.

In a case where the reflective layer 20 is disposed as part of the wiring layer 36 in this manner, the photodetector 10C can also produce the same effects as those in the first embodiment as a result of disposing the reflective layer 20 on the second surface 15B side of the first light detection areas 140.

Fourth Embodiment

In the present embodiment, a photodetector in which light detection layers are stacked will be described.

Figure 4:
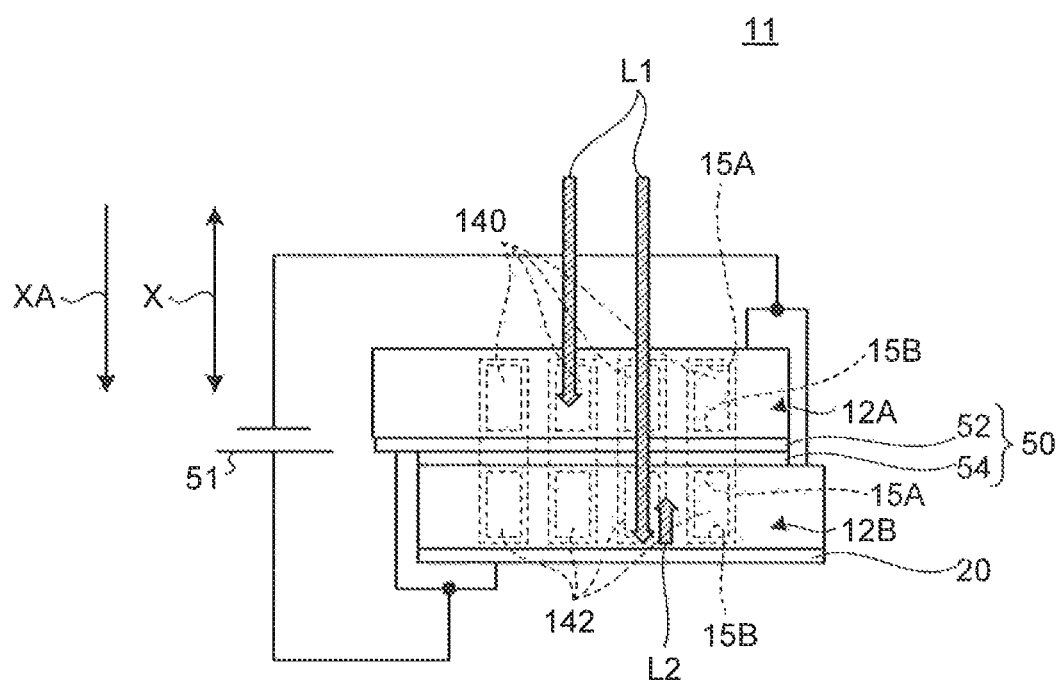
FIG. 4 is a diagram illustrating an example of a photodetector.

FIG. 4 is a diagram illustrating an example of a photodetector 11 of the present embodiment. In the present embodiment, one example in which two light detection layers are stacked will be described.

The photodetector 11 is a stack of multiple light detection layer. Specifically, the photodetector 11 includes the first light detection layer 12A described in the embodiments above, a second light detection layer 12B having second light detection areas 142, and a reflective layer 20.

The second light detection layer 12B has the same structure as the first light detection layer 12A except that the second light detection layer 12B has the second light detection areas 142 instead of the first light detection areas 140. In each of the second light detection areas 142, similarly to the first light detection areas 140, a p-n junction is formed by an n-type semiconductor layer containing Si as a main component and a p-type semiconductor layer containing Si as a main component and being adjacent to the n-type semiconductor layer.

The second light detection areas 142 have a first surface 15A on which light is incident and a second surface 15B opposite to the first surface 15A similarly to the first light detection areas 140.

The first light detection layer 12A and the second light detection layer 12B are stacked in such a manner that the second surface 15B of the first light detection areas 140 included in the first light detection layer 12A and the second surface 153 of the second light detection areas 142 included in the second light detection layer 123 face the same direction.

The photodetector 11 includes the reflective layer 20. The reflective layer 20 reflects at least part of light in the near-infrared range similarly to that in the first embodiment. The thickness and the material of the reflective layer 20 are the same as those in the first embodiment.

In the present embodiment, the second light detection layer 123 is provided between the first light detection layer 12A and the reflective layer 20.

The photodetector 11 further includes an intermediate layer 50. The intermediate layer 50 is provided between the first light detection layer 12A and the second light detection layer 12B. The intermediate layer 50 is preferably made of a material that transmits at least part of light in the wavelength range to which the first light detection areas 140 are sensitive, at least part of light in the wavelength range to which the second light detection areas 142 are sensitive, and at least part of light in the near-infrared range. At least part of light in the wavelength range to which the first light detection areas 140 are sensitive refers to light having at least certain wavelengths of light in the wavelength range to which the first light detection areas 140 are sensitive.

Thus, an electrode layer 52 included in the intermediate layer 50 is preferably a transparent electrode that transmits at least part of light in the near-infrared range and at least part of light in the wavelength range to which the first light detection areas 140 are sensitive.

Furthermore, an antireflection layer 54 is preferably provided between layers where the difference in diffraction index therebetween is equal to or larger than a threshold in the photodetector 11 among between the first light detection layer 12A and the intermediate layer 50, between the intermediate layer 50 and the second light detection layer 12B, and between the second light detection layer 12B and the reflective layer 20. The antireflection layer 54 is a layer that prevents reflection of at least part of light in the wavelength range to which the first light detection areas 140 are sensitive, at least part of light in the wavelength range to which the second light detection areas 142 are sensitive, and light in the near-infrared range. The threshold may be adjusted in advance so that at least 90% of light incident on the first light detection layer 12A and on the second light detection layer 12B can reach the first light detection areas 140 in the first light detection layer 12A and the second light detection areas 142 in the second light detection layer 12B, respectively.

In a case where the antireflection layer 54 is provided between the electrode layer 52 included in the intermediate layer 50 and the second light detection layer 12B, the antireflection layer 54 preferably has properties of preventing reflection of at least part of light in the wavelength range to which the first light detection areas 140 are sensitive and transmitting at least part of light in the near-infrared range. Thus, the antireflection layer 54 and the electrode layer 52 constitute the intermediate layer 50.

The antireflection layer 54 is a single layer of a silicon oxide film or a nitride film, or a stack of these films, for example.

Voltage is applied to the photodetector 11 from a power supply 51. Note that the first surface 15A of the first light detection areas 140 included in the first light detection layer 12A and the first surface 15A of the second light detection areas 142 included in the second light detection layer 12B of the photodetector 11 may be a surface on the n-type semiconductor layer side of the p-n junctions or may be a surface on the p-type semiconductor layer (the p− type semiconductor layers 14A and the p+ type semiconductor layers 14B) side of the p-n junctions.

Thus, the first surfaces 15A of both of the first light detection layer 12A and the second light detection layer 12B included in the photodetector 11 may be the surfaces on the n-type semiconductor substrate 14C (the n-type semiconductor layer) side of the p-n junctions. Alternatively, the first surfaces 15A of both of the first light detection layer 12A and the second light detection layer 12B included in the photodetector 11 may be the surfaces on the p-type semiconductor layer (the p− type semiconductor layers 14A and the p+ type semiconductor layers 143) side of the p-n junctions.

Alternatively, the photodetector 11 may be a stack in which the first light detection layer 12A (or the second light detection layer 12B) having the first surface 15A that is the surface on the n-type semiconductor substrate 14C side of the p-n junctions and the second light detection layer 12B (or the first light detection layer 12A) having the second surface 15B that is the surface on the n-type semiconductor substrate 14C side of the p-n junctions are stacked in combination.

In these cases, the first light detection layer 12A and the second light detection layer 12B may be stacked in such a manner that the second surface 15B of the first light detection layer 12A and the second surface 15B of the second light detection layer 12B face the same direction (see an arrow XA in FIG. 4).

Note that the number of stacked light detection layers (the first light detection layer 12A and the second light detection layer 12B) included in the photodetector 11 is not limited to two as illustrated in FIG. 4. For example, the number of stacked light detection layers included in the photodetector 11 may be three or five.

Furthermore, of the first light detection areas 140 included in the first light detection layer 12A and the second light detection areas 142 included in the second light detection layer 12B, the second light detection areas 142 positioned closer to the reflective layer 20 preferably have a thickness larger than that of the first light detection areas 140.

When three or more light detection layers are included in the photodetector 11, a light detection layer positioned closer to the reflective layer 20 preferably includes light detection areas having a larger thickness.

FIGS. 5, 7 to 9 are schematic diagrams illustrating examples of specific structures of the photodetector 11. In the description of FIGS. 5, 7 to 9, the photodetectors 10A to 10C described in the embodiments above may be collectively referred to as photodetectors 10.

Figure 5:
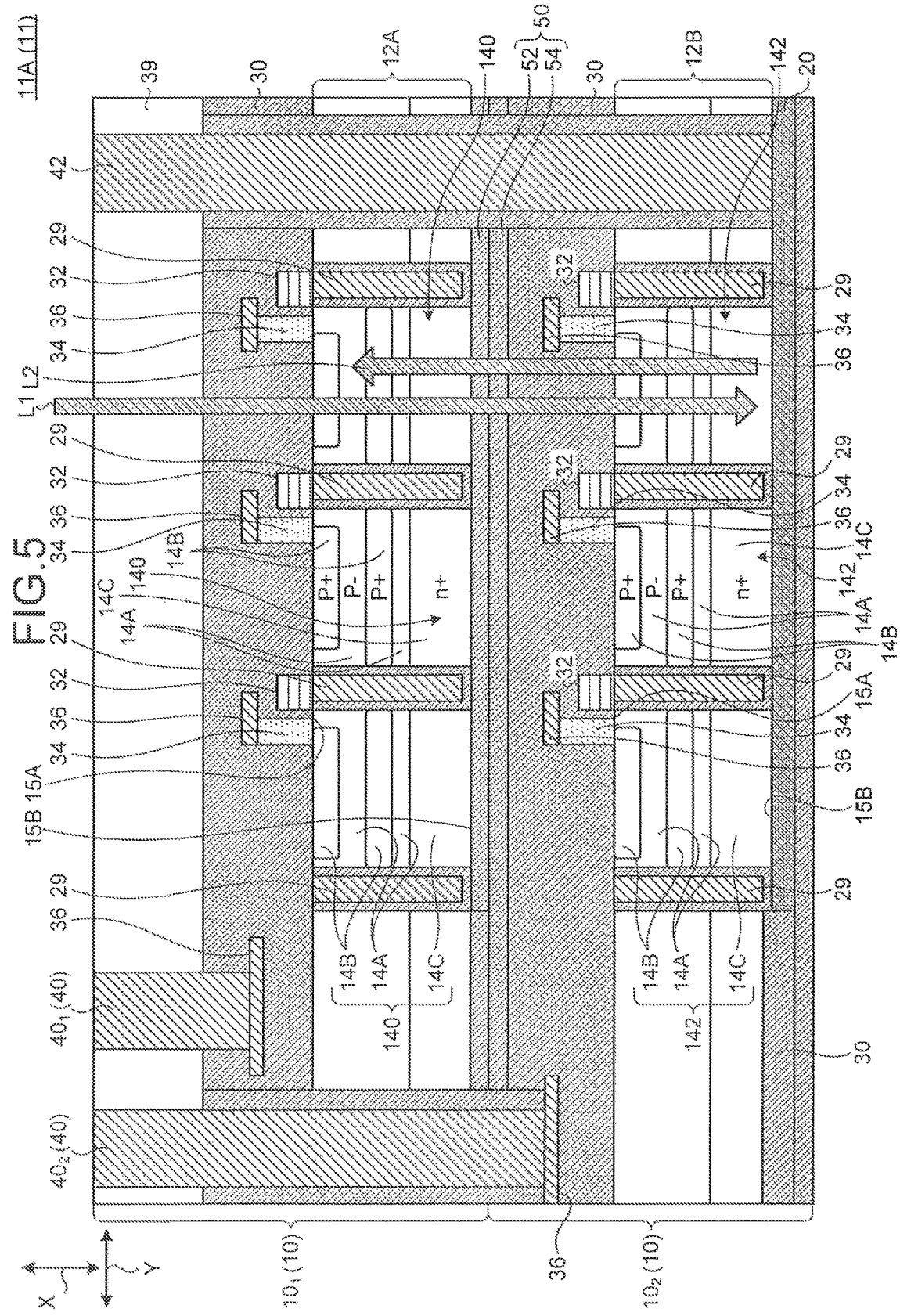
FIG. 5 is a diagram illustrating an example of a photodetector.

FIG. 5 is a schematic diagram illustrating an example of a photodetector 11A. The photodetector 11A is a photodetector 11 in which a photodetector $10_1$ including the first light detection layer 12A and a photodetector $10_2$ including the second light detection layer 12B are stacked.

The photodetector $10_1$ and the photodetector $10_2$ are the same as the photodetectors 10 described in the embodiments above. Note that the disposition position and the like of the reflective layer 20 may be different from that of the photodetectors 10.

Specifically, the photodetector $10_1$ has the same structure as the photodetector 10B illustrated in FIG. 2 except that the photodetector $10_1$ does not include the reflective layer 20. The photodetector $10_2$ has the same structure as the photodetector 10B illustrated in FIG. 2 except that the photodetector $10_2$ does not include the adhesive layer 24.

Note that the photodetector $10_1$ includes an electrode layer 52 instead of the reflective layer 20 that also functions as a cathode electrode in the photodetector 10B illustrated in FIG. 2. The electrode layer 52 is a transparent electrode that transmits at least part of light in the wavelength range to which the first light detection areas 140 are sensitive, at least part of light in the wavelength range to which the second light detection areas 142 are sensitive, and at least part of light in the near-infrared range. In addition, the electrode layer 52 is connected to a via electrode 42. An antireflection layer 54 is provided between the photodetector $10_1$ and the photodetector $10_2$.

The photodetector 11A has a structure in which the first light detection layer 12A and the second light detection layer 12B included in the photodetector 11A are stacked in such a manner that the first surfaces 15A thereof are the surfaces of the first light detection areas 140 included in the first light detection layer 12A and the second light detection areas 142 included in the second light detection layer 123 on the p-type semiconductor layer (the p− type semiconductor layers 14A and the p+ type semiconductor layers 14B) side.

Note that the wiring layer 36 of the photodetector $10_1$ is connected to a via electrode $40_1$. The via electrode $40_1$ functions as an anode electrode of the photodetector $10_1$. The wiring layer 36 of the photodetector $10_2$ is connected to a via electrode $40_2$. The via electrode $40_2$ functions as an anode electrode of the photodetector $10_2$.

In the photodetector 11A, the second light detection layer 123 is provided between the first light detection layer 12A and the reflective layer 20.

In other words, in the photodetector 11A, the reflective layer 20 is provided on the second surface 15E side of the first light detection layer 12A in the photodetector $10_2$ including the second light detection layer 12B.

In the photodetector $10_2$, the reflective layer 20 also functions as a cathode electrode and is connected to the via electrode 42. In the present embodiment, the electrode layer 52, the reflective layer 20, and the via electrode 42 function as a cathode electrode.

In the example illustrated in FIG. 5, when the first light detection areas 140 included in the first light detection layer 12A and the second light detection areas 142 included in the second light detection layer 12B are projected onto a third surface parallel to the first surface 14A of the first light detection layer 12A, at least part of the first light detection areas 140 overlap with the second light detection areas 142.

Thus, the positions in the direction of an arrow Y in FIG. 5 of at least part of the first light detection areas 140 and the second light detection areas 142 coincide in the first light detection layer 12A and the second light detection layer 12B.

When light (see incident light L1 in FIG. 5) enters the photodetector 11A from the first surface 15A of the first light detection areas 140, the light first enters the first light detection areas 140 included in the first light detection layer 12A of the photodetector $10_1$ and then reaches the first light detection layer 12A of the photodetector $10_2$.

The light that has entered the second light detection areas 142 included in the second light detection layer 12B of the photodetector $10_2$ is then reflected by the reflective layer 20 toward the first light detection areas 140 included in the first light detection layer 12A via the second light detection areas 142 included in the second light detection layer 12B (see reflected light L2 in FIG. 5).

Since the photodetector 11A is a stack including the first light detection layer 12A and the second light detection layer 12B in this manner, light (specifically, photons) that has not been detected in the first light detection areas 140 included in the first light detection layer 12A positioned at the most upstream in the light incidence direction are sequentially detected in the second light detection areas 142 included in the second light detection layer 12B positioned downstream in the light incidence direction.

If a photon enters the first light detection areas 140 included in the first light detection layer 12A positioned at the first layer on the upstream side in the light incidence direction and a second photon enters the first light detection areas 140 while avalanche multiplication is taking place (during dead time), for example, the second photon cannot be counted in the first light detection areas 140 since a multiplying phenomenon has already occurred. The photon that has not been detected in the first layer during avalanche multiplication by the first layer can, however, be counted in the second light detection areas 142 included in the second light detection layer 12B positioned at the second layer in the light incidence direction. Thus, the dynamic range (the number of counted photons) can be improved.

Furthermore, the reflective layer 20 is provided on the second surface 15B side of the second light detection areas 142 included in the second light detection layer 12B positioned at the most downstream in the light incidence direction. Thus, with the reflection by the reflective layer 20, the light path lengths of light entering the first light detection areas 140 and the second light detection areas 142 can be made longer than those in a structure without the reflective layer 20.

The photodetector 11 of the present embodiment can therefore produce the same effects as those in the embodiments above and improve the dynamic range (the number of counted photons). Specifically, the photodetector 11 of the present embodiment including the first light detection layer 12A, the second light detection layer 12B, and the reflective layer 20 can increase the dynamic range by 1.5 times or more than a structure without the second light detection layer 12B (without stacking light detection layers) and without the reflective layer 20. Furthermore, when three light detection layers are stacked, the dynamic range is deemed to be increased by 1.67 times.

Figure 6:
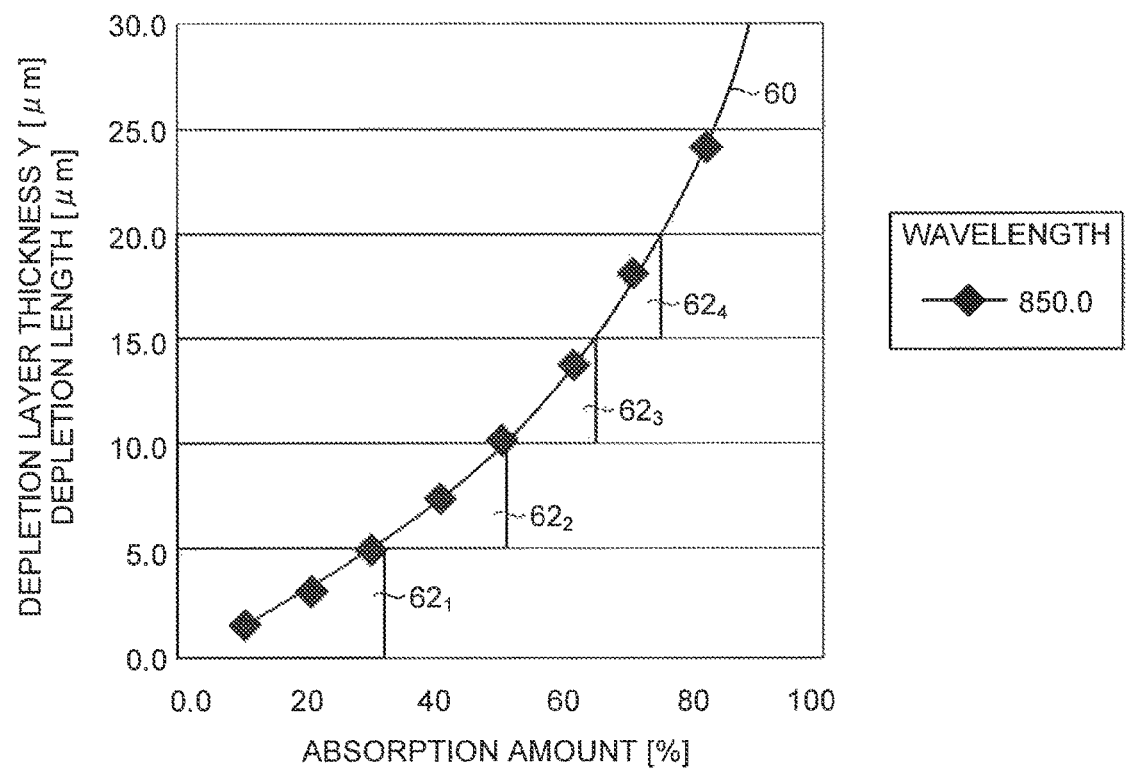
FIG. 6 is a graph illustrating relation between light absorption amount and the thickness of depletion layers.

FIG. 6 is a graph illustrating the relation between the amount of absorption of light at 850 nm in the near-infrared range and the thickness of the depletion layers in a photodetector 11A in which four light detection layers each having depletion layers with a thickness of 5 µm in light detection areas (a structure similar to those of the first light detection layer 12A and the second light detection layer 12B) are stacked.

A graph 60 represents the amount (%) of absorption of light having a wavelength of 850 nm in the near-infrared range.

As illustrated in FIG. 6, in depletion layers in the first light detection layer from the light incidence side of the photodetector 11A, the amount of absorption of light having a wavelength in the near-infrared range is 30% as represented by a graph $62_1$. In depletion layers in the second light detection layer from the light incidence side, the amount of absorption of light having a wavelength in the near-infrared range is 20% as represented by a graph $62_2$. Furthermore, in depletion layers in the third light detection layer from the light incidence side, the amount of absorption of light having a wavelength in the near-infrared range is 15% as represented by a graph $62_3$, and in depletion layers in the fourth light detection layer, the amount of absorption of light having a wavelength in the near-infrared range is 10% as represented by a graph $62_4$. Note that these graphs $62_1$ to $62_4$ indicate cumulative values of the absorption amount from the first light detection layer. Thus, the actual, absorption amount of each layer is the difference from the absorption amount indicated by the preceding graph.

As a result of stacking multiple light detection layers in this manner, it can be deemed that light that has not been detected in a light detection layer positioned on the upstream side in the light incidence direction can be detected in a light detection layer position on the downstream side. Furthermore, the amount of absorption of light having wavelengths in the near-infrared range in the photodetector 11 increases from 30% to 50%, 65%, and 75% as the number of stacked light detection layers is larger, as compared to the amount of absorption of light having wavelengths in the near-infrared range in a photodetector in which only one light detection layer is used, which is 30% (see the graph 60).

Furthermore, as illustrated in FIG. 5, as a result of forming the reflective layer 20 on the second surface 15C side of the second light detection layer (the second light detection layer 12B in the photodetector $10_2$), photons pass through the first light detection areas 140 included in the first light detection layer 12A that is the first layer and through the second light detection areas 142 included in the second light detection layer 12B that is the second layer in this order, are then reflected by the reflective layer 20, and pass through the second light detection areas 142 included in the second light detection layer 12B that is the second layer and through the first light detection areas 140 included in the first light detection layer 12A that is the first layer in this order. Thus, the photons pass through practically four light detection layers (light detection areas). An absorption efficiency equal to that when four light detection layers are used can therefore be achieved.

The description refers back to FIG. 5. Although FIG. 5 illustrates the photodetector 11A having a structure in which the first light detection layer 12A and the second light detection layer 12B are stacked, the photodetector 11A may have a structure in which three or more light detection layers are stacked as described above. Furthermore, a reflective layer 20 may be formed on the lower most layer (the nearest to the second surface) of a stack, so that the light path length is twice as long as the number of stacked layers as described above.

Furthermore, FIG. 5 illustrates the photodetector 11A having a structure in which the first surfaces 15A of both of the first light detection layer 12A and the second light detection layer 12B are the surfaces on the p-type semiconductor layer (the p− type semiconductor layers 14A and the p+ type semiconductor layers 14B) side.

The photodetector 11 may, however, include the first light detection layer 12A (or the second light detection layer 12B) having the first surface 15A that is the surface of the first light detection areas 140 (or the second light detection areas 142) on the p-type semiconductor layer side and the second light detection layer 12B (or the first light detection layer 12A) having the second surface 15B that is the surface of the second light detection areas 142 (or the first light detection areas 140) on the n-type semiconductor substrate 14C side, which are stacked in combination.

Figure 7:
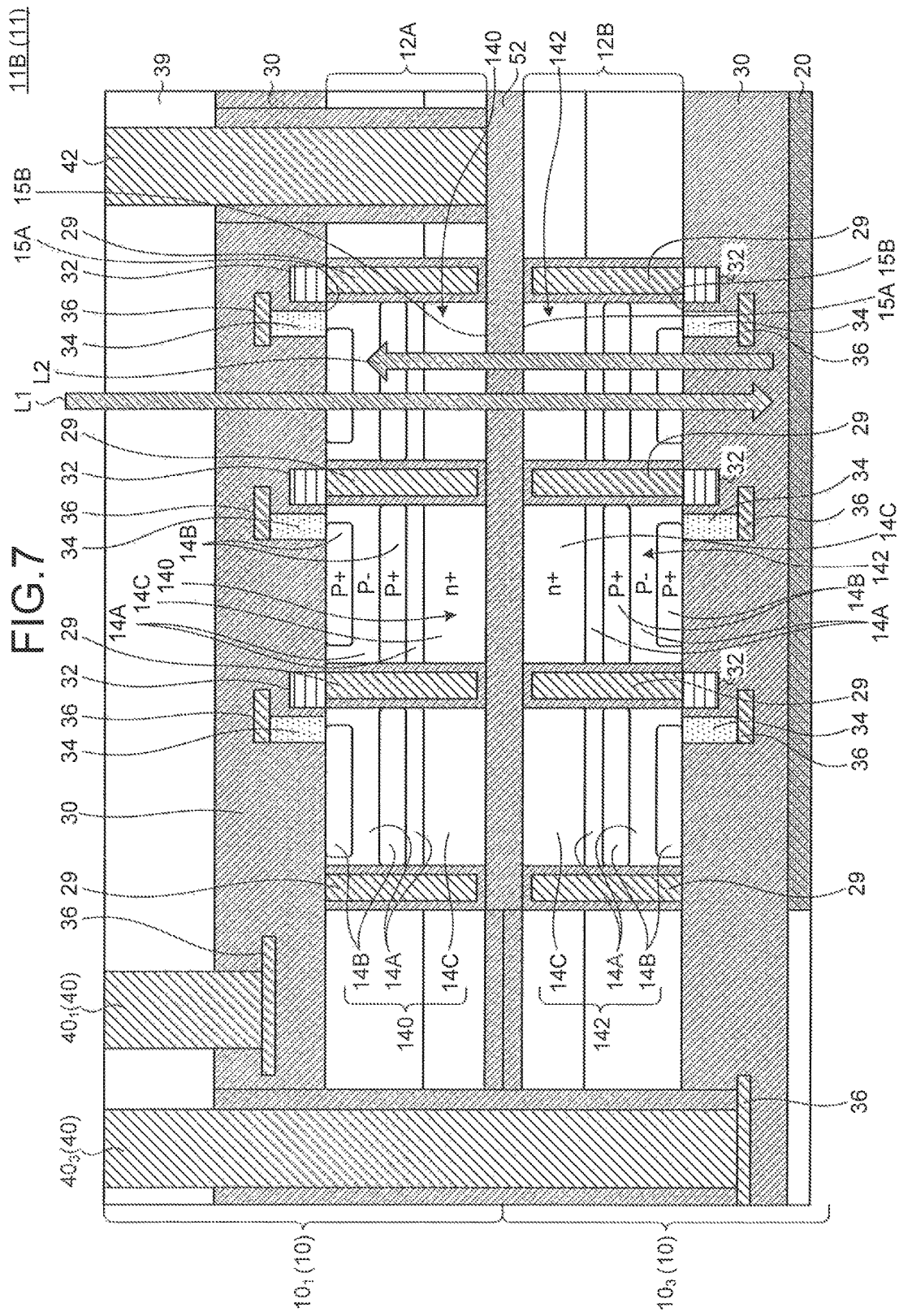
FIG. 7 is a schematic diagram of a photodetector.

FIG. 7 is a schematic diagram of a photodetector 11B.

The photodetector 11B is a photodetector 11 in which the photodetector 10 including the first light detection layer 12A and a photodetector $10_3$ including the second light detection layer 12B are stacked.

The photodetector $10_1$ has the same structure as the photodetector 10B illustrated in FIG. 2 except that the photodetector $10_1$ does not include the reflective layer 20.

Note that the photodetector $10_1$ includes an electrode layer 52 instead of the reflective layer 20 that also functions as a cathode electrode in the photodetector 10B illustrated in FIG. 2. The electrode layer 52 is a transparent electrode that transmits at least part of light in the wavelength range to which the first light detection areas 140 are sensitive, at least part of light in the wavelength range to which the second light detection areas 142 are sensitive, and at least part of light in the near-infrared range. In the photodetector 11B, the electrode layer 52 also functions as a cathode electrode of the photodetector $10_3$.

The photodetector $10_3$ has the same structure as the photodetector 10B illustrated in FIG. 2. The photodetector $10_3$, however, does not include the support substrate 39 and the adhesive layer 24. In addition, the photodetector $10_3$ has a structure in which the stack of the first light detection layer 12A and the insulating layer 30 of the photodetector 10B is vertically reversed as compared to that illustrated in FIG. 2, and positioned on the electrode layer 52 side of the photodetector $10_1$. Furthermore, the photodetector $10_3$ includes the second light detection layer 12B instead of the first light detection layer 12A. Thus, in the photodetector $10_3$, the surface on the p-type semiconductor layer (the p− type semiconductor layers 14A and the p+ type semiconductor layers 143) side of the p-n junctions in the second light detection areas 142 is the second surface 15B, and the surface on the n-type semiconductor substrate 14C side is the first surface 15A.

Furthermore, in the photodetector $10_3$, the reflective layer 20 is provided on the second surface 15B side of the second light detection areas 142 included in the second light detection layer 12B, that is, on the quenching resistors 32 side of the second light detection areas 142.

In this manner, the photodetector 11B has a structure in which the first light detection layer 12A having the first surface 15A that is the surface of the first light detection areas 140 on the p-type semiconductor layer side and the second light detection layer 12B having the first surface 15A that is the surface of the second light detection areas 142 on the n-type semiconductor substrate 14C side are stacked.

Furthermore, in the photodetector 11B, the second light detection layer 12B is disposed between the first light detection layer 12A and the reflective layer 20. In other words, the reflective layer 20 is provided on the second surface 153 side of the second light detection layer 12B among the first light detection layer 12A and the second light detection layer 12B provided in the photodetector 11B.

Note that the wiring layer 36 of the photodetector $10_1$ is connected to a via electrode $40_1$. The via electrode 40 functions as an anode electrode of the photodetector $10_1$. The wiring layer 36 of the photodetector $10_3$ is connected to a via electrode $40_2$. The via electrode $40_2$ functions as an anode electrode of the photodetector $10_3$.

The electrode layer 52 is connected to a via electrode 42. In the present embodiment, the electrode layer 52 and the via electrode 42 functions as a cathode electrode of the photodetector $10_1$ and the photodetector $10_3$.

When light (see incident light L1 in FIG. 7) enters the photodetector 11B from the first surface 15A of the first light detection areas 140, the light first enters the first light detection areas 140 included in the first light detection layer 12A of the photodetector $10_1$ and then reaches the second light detection areas 142 included in the second light detection layer 12B of the photodetector $10_3$.

The light that has entered the second light detection areas 142 of the photodetector $10_3$ is then reflected by the reflective layer 20 toward the first light detection areas 140 included in the first light detection layer 12A via the second light detection areas 142 included in the second light detection layer 12B (see reflected light L2 in FIG. 7).

Thus, similarly to the photodetector 11A, the photodetector 11B can produce the same effects as those in the embodiments above and improve the dynamic range (the number of counted photons).

Alternatively, a photodetector 11 having a structure in which the first light detection layer 12A having the first surface 15A that is the surface of the first light detection areas 140 on the n-type semiconductor substrate 14C side and the second light detection layer 12E having the first surface 15A that is the surface of the second light detection areas 142 on the n-type semiconductor substrate 14C side are stacked may be used.

Figure 8:
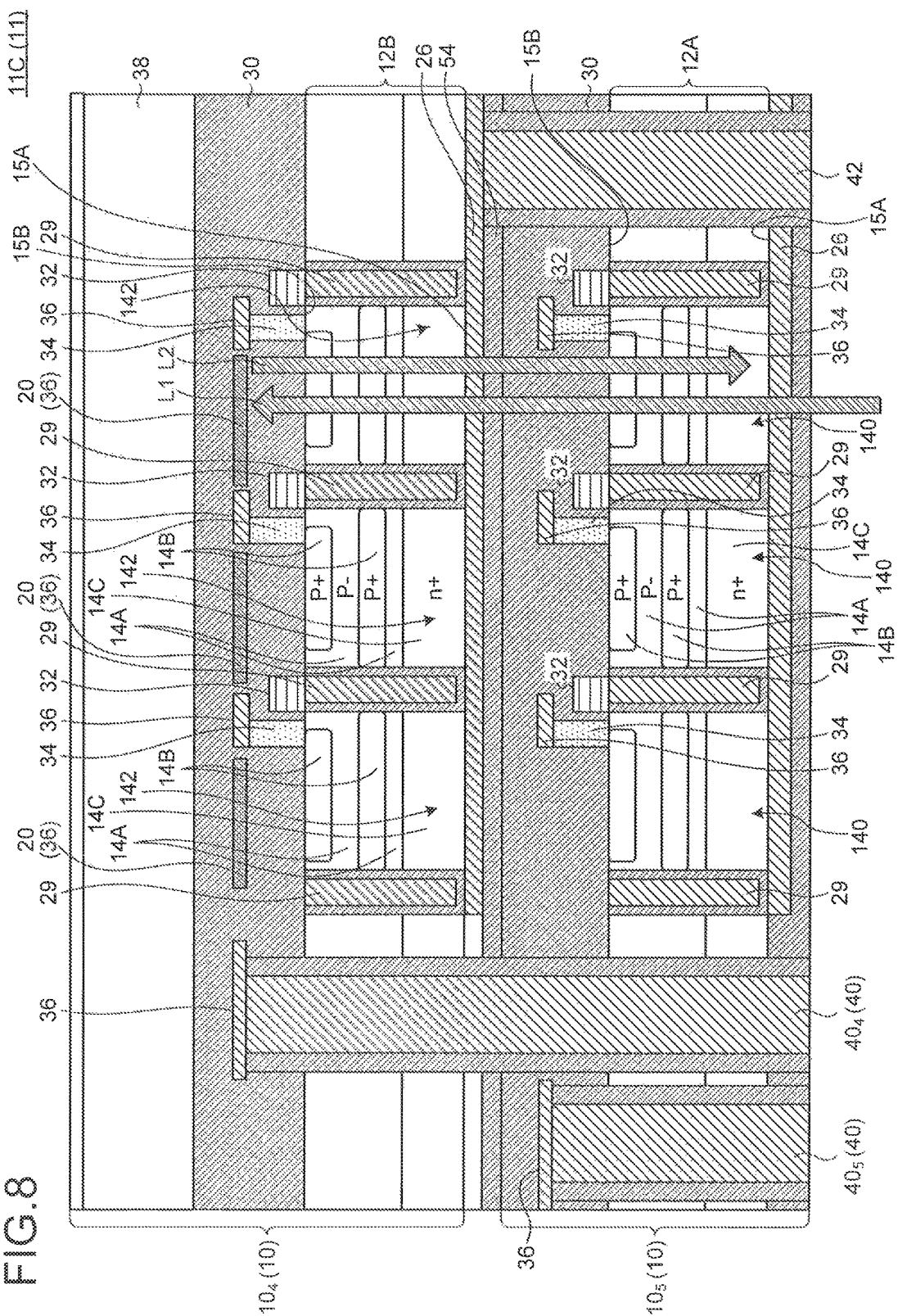
FIG. 8 is a schematic diagram illustrating an example of a photodetector.

FIG. 8 is a schematic diagram illustrating an example of a photodetector 11C. The photodetector 11C is a photodetector 11 in which a photodetector $10_4$ including the second light detection layer 12B and a photodetector $10_5$ including the first light detection layer 12A are stacked.

The photodetector $10_4$ has the same structure as the photodetector 10C illustrated in FIG. 3.

In the photodetector $10_4$, the electrode layer 26 in the photodetector 10C illustrated in FIG. 3 is a transparent electrode that transmits at least part of light in the wavelength range to which the first light detection areas 140 are sensitive, at least part of light in the wavelength range to which the second light detection areas 142 are sensitive, and at least part of light in the near-infrared range as described with reference to FIG. 3, and has the same function as that of the electrode layer 52. The wiring layer 36 of the photodetector $10_4$ is connected to a via electrode $40_4$ that is the via electrode 40. The via electrode $40_4$ functions as an anode electrode of the second light detection areas 142 of the photodetector $10_4$.

The photodetector $10_5$ has the same structure as the photodetector 10C illustrated in FIG. 3 except that the photodetector $10_5$ does not include the reflective layer 20 and the support substrate 38. The wiring layer 36 of the photodetector $10_5$ is connected to a via electrode $40_5$ that is the via electrode 40. The via electrode $40_5$ functions as an anode electrode of the first light detection areas 140 of the photodetector $10_5$.

The electrode layer 26 functions as a cathode electrode. The electrode layers 26 of the photodetector $10_4$ and the photodetector $10_5$ are connected to a via electrode 42.

In this manner, the photodetector 11C has a structure in which the first light detection layer 12A having the first surface 15A that is the surface of the first light detection areas 140 on the n-type semiconductor substrate 14C side and the second light detection layer 12B having the first surface 15A that is the surface of the second light detection areas 142 on the n-type semiconductor substrate 14C side are stacked.

In the photodetector 11C, the second light detection layer 12B is provided between the first light detection layer 12A and the reflective layer 20. In other words, the reflective layer 20 is provided on the second surface 15B side of the first light detection layer 12A positioned at the most downstream in the direction of the second surface 15B (see the direction of an arrow XA in FIG. 4) among the first light detection layer 12A and the second light detection layer 12B.

When light (see incident light L1 in FIG. 8) enters the photodetector 11C from the first surface 15A of the first light detection areas 140, the light first enters the first light detection areas 140 included in the first light detection layer 12A of the photodetector $10_5$ and then reaches the second light detection areas 142 included in the second light detection layer 123 of the photodetector $10_4$.

The light that has entered the second light detection areas 142 included in the second light detection layer 12B of the photodetector $10_4$ is then reflected by the reflective layer 20 toward the first light detection areas 140 included in the first light detection layer 12A of the photodetector $10_5$ via the second light detection areas 142 included in the second light detection layer 12B of the photodetector $10_4$ (see reflected light L2 in FIG. 8).

Thus, similarly to the photodetector 11A, the photodetector 11C can produce the same effects as those in the embodiments above and improve the dynamic range (the number of counted photons).

Note that, in the photodetector 11A, the via electrode $40_1$ and the via electrode $40_2$ are used for the anode electrodes of the first light detection areas 140 included in the first light detection layer 12A and the second light detection areas 142 included in the second light detection layer 12B (see FIG. 5). The first light detection areas 140 included in the first light detection layer 12A and the second light detection areas 142 included in the second light detection layer 12B may be connected to a common anode electrode.

Figure 9:
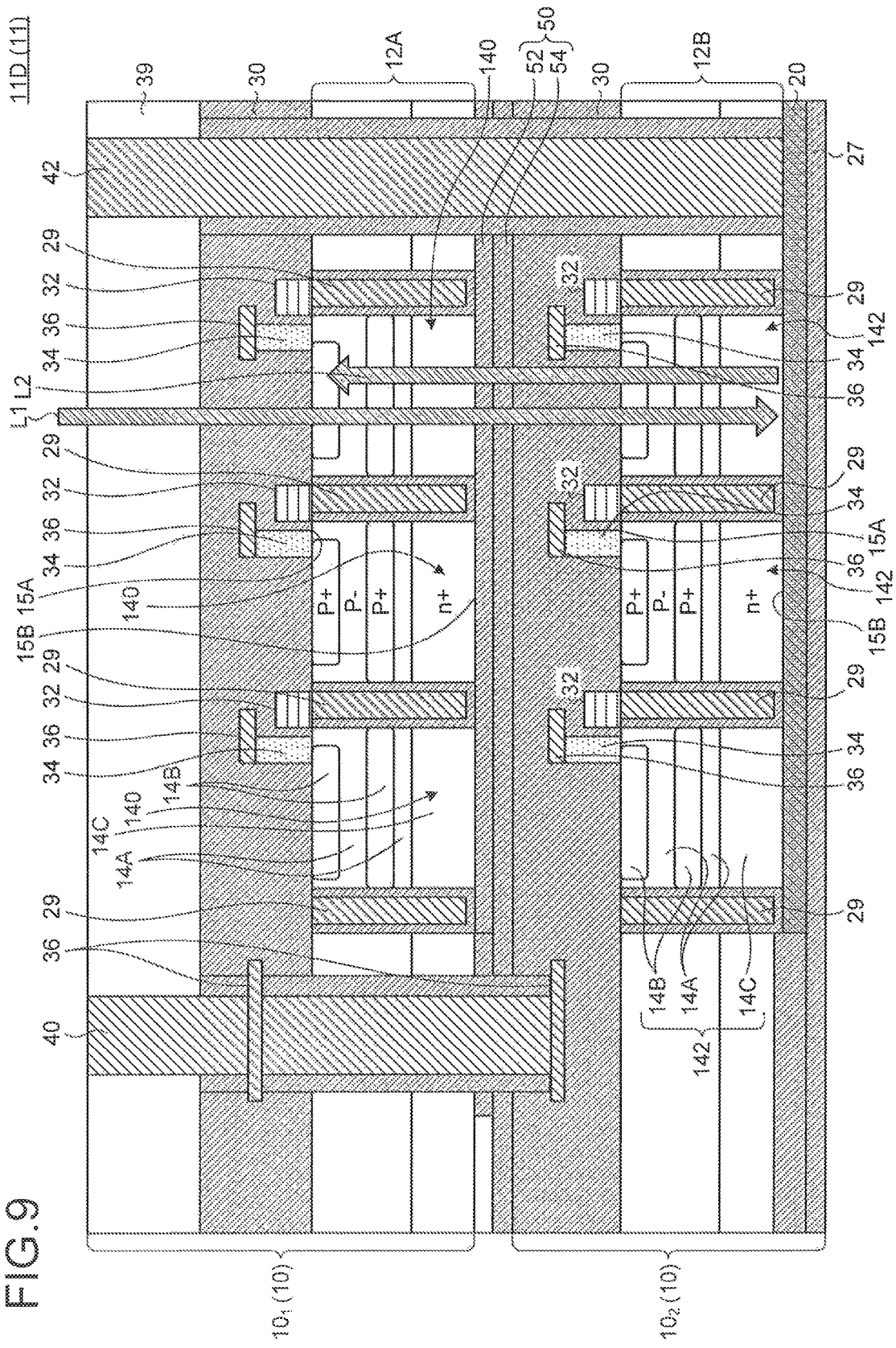
FIG. 9. is a schematic diagram illustrating an example of a photodetector.

FIG. 9 is a schematic diagram illustrating an example of a photodetector 11D. The photodetector 11D is a stack of a photodetector $10_1$ and a photodetector $10_2$. Note that the photodetector 11D has the same structure as the photodetector 11A of FIG. 5 except that the via electrode $40_1$ (see FIG. 5) of the photodetector $10_1$ and the via electrode $40_2$ (see FIG. 5) of the photodetector $10_2$ are replaced by a common via electrode 40. In addition, a protective film 27 may be stacked on the reflective layer 20 as illustrated in FIG. 9.

In this manner, the anode electrodes of the first light detection layer 12A and the second light detection layer 12B may be connected to a common via electrode 40.

Note that, as illustrated in FIGS. 5, 7, and 8, when the anode electrodes of the first light detection layer 12A and the second light detection layer 12B constituting the photodetector 11 are connected to different via electrodes 40 that are different for the respective first light detection layer 12A and second light detection layer 12b, holes corresponding to the via electrodes 40 can be formed in the insulating layer 30 at positions shifted in a zigzag manner, so that the manufacturing processes are simplified.

Figure 10:
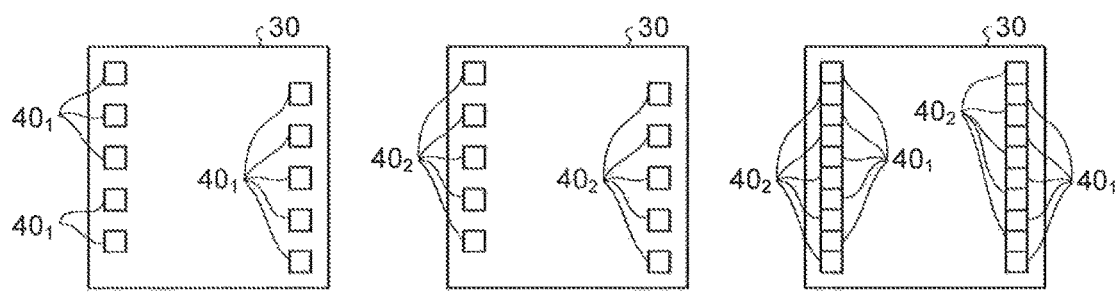
FIGS. 10A to 10C are explanatory diagrams of arrangement of via electrodes.

FIGS. 10A to 10C are explanatory diagrams of arrangement of the via electrodes 40. As illustrated in FIGS. 10A and 10B, an insulating layer 30 in which through-holes corresponding to multiple via electrodes $40_1$ are arranged in a zigzag manner and an insulating layer 30 in which through-holes corresponding to multiple via electrodes $40_2$ are arranged in a zigzag manner are provided. One of these two insulating layers 30 is reversed and adhered to the other insulating layer 30 (see FIG. 10C). As a result, a photodetector 11 in which multiple light detection layers (the first light detection layer 12A and the second light detection layer 12B) are stacked is preferably formed.

The example illustrated in FIG. 5 illustrates a case in which, when the first light detection areas 140 included in the first light detection layer 12A and the second light detection areas 142 included in the second light detection layer 12B are projected onto a third surface parallel to the first surface 15A of the first light detection layer 12A, at least part of the first light detection areas 140 overlap with the second light detection areas 142.

Alternatively, however, when the first light detection areas 140 included in the first light detection layer 12A and the second light detection areas 142 included in the second light detection layer 12B are projected onto a third surface parallel to the first surface 15A of the first light detection layer 12A, at least part of the first light detection areas 140 may not overlap with the second light detection areas 142.

Fifth Embodiment

Next, a method for manufacturing the photodetector 10 of the embodiments described above will be described.

FIGS. 11 to 19 are explanatory diagrams illustrating an example of the method for manufacturing the photodetector 10A described in the first embodiment.

Figure 11:
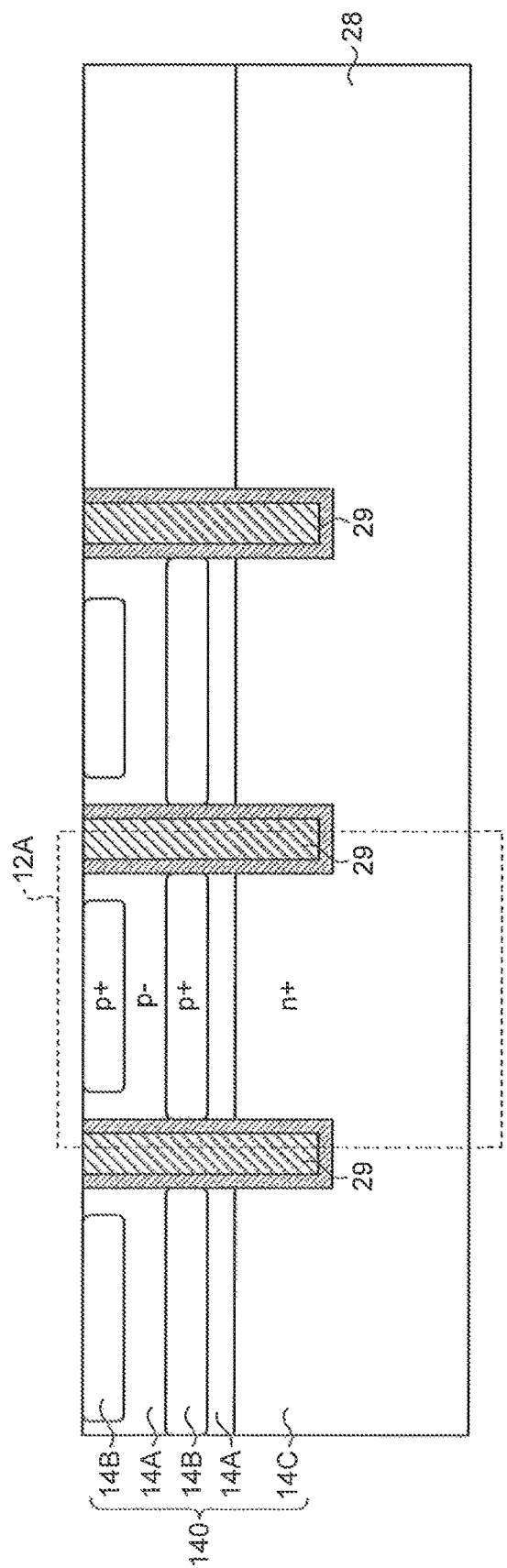
FIG. 11 is an explanatory diagram illustrating an example of a method for manufacturing a photodetector.

As illustrated in FIG. 11, first, an n-type semiconductor substrate 28 is provided. A known semiconductor production process is performed on the n-type semiconductor substrate 28 to form first light detection areas 140. Specifically, first, a p– type semiconductor layer 14A that is a silicon epitaxial layer is formed on the n-type semiconductor substrate 28 through epitaxial growth of silicon. A dopant (boron, for example) is then implanted so that part of the p– type semiconductor layer 14A becomes a p+ type semiconductor layer 14B. As a result, multiple first light detection areas 140 are formed on the n-type semiconductor substrate 28. The length of each of the first light detection areas 140 in the direction in which the first light detection areas 140 are arranged is 800 µm, for example.

Subsequently, element isolation of the first light detection areas 140 is performed so that the first light detection areas 140 will not electrically interfere with one another. The element isolation is achieved by making regions between the first light detection areas 140 have a deep trench isolation structure or have a channel stopper structure through dopant (phosphorus, for example) implantation, for example. As a result of the element isolation, element isolation regions 29 are formed between the first light detection areas 140. Note that the element isolation regions 29 reach a region of the n-type semiconductor substrate 14C.

Figure 12:
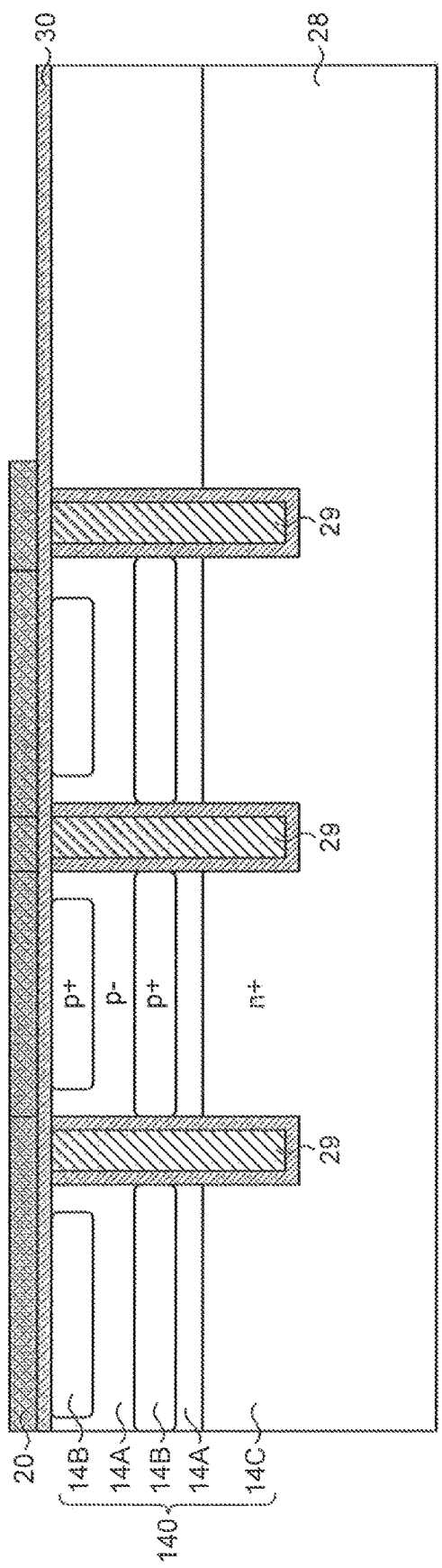
FIG. 12 is an explanatory diagram illustrating the example of the method for manufacturing a photodetector.

Subsequently, as illustrated in FIG. 12, an insulating layer 30 is formed on multiple first light detection areas 140. Subsequently, a reflective layer 20 is formed on the first light detection areas 140 with the insulating layer 30 therebetween.

Figure 13:
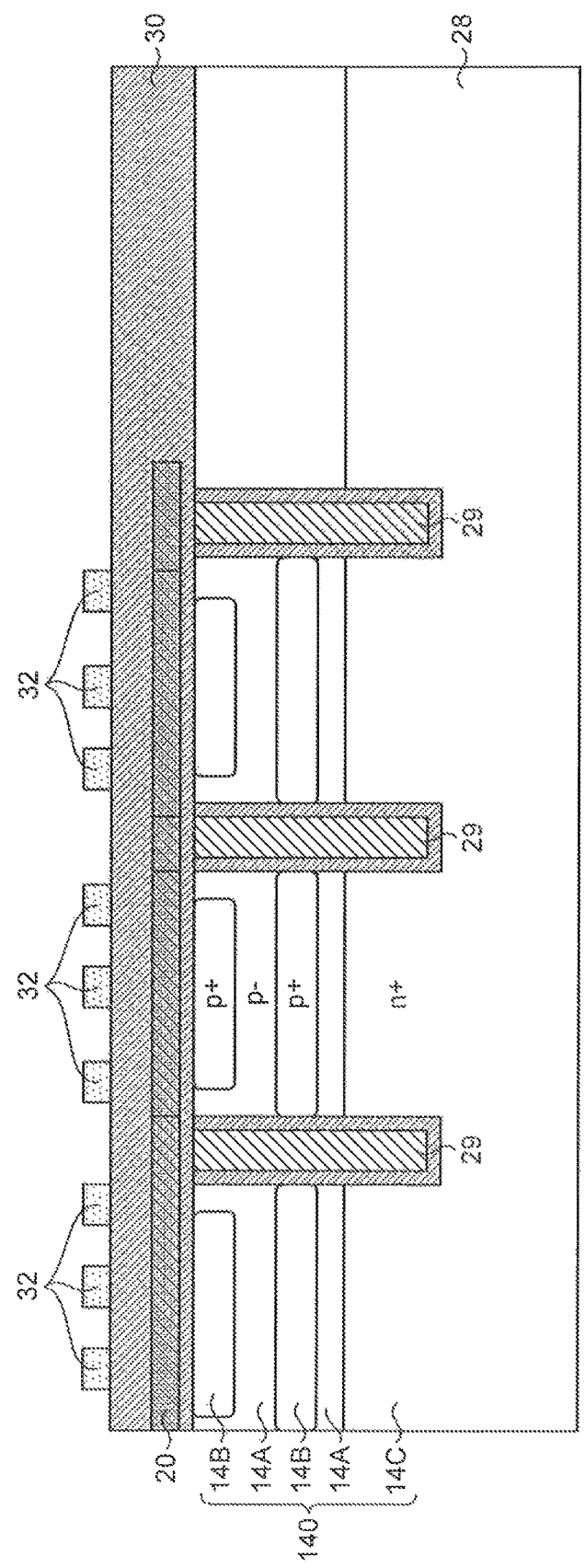
FIG. 13 is an explanatory diagram illustrating the example of the method for manufacturing a photodetector.
Figure 14:
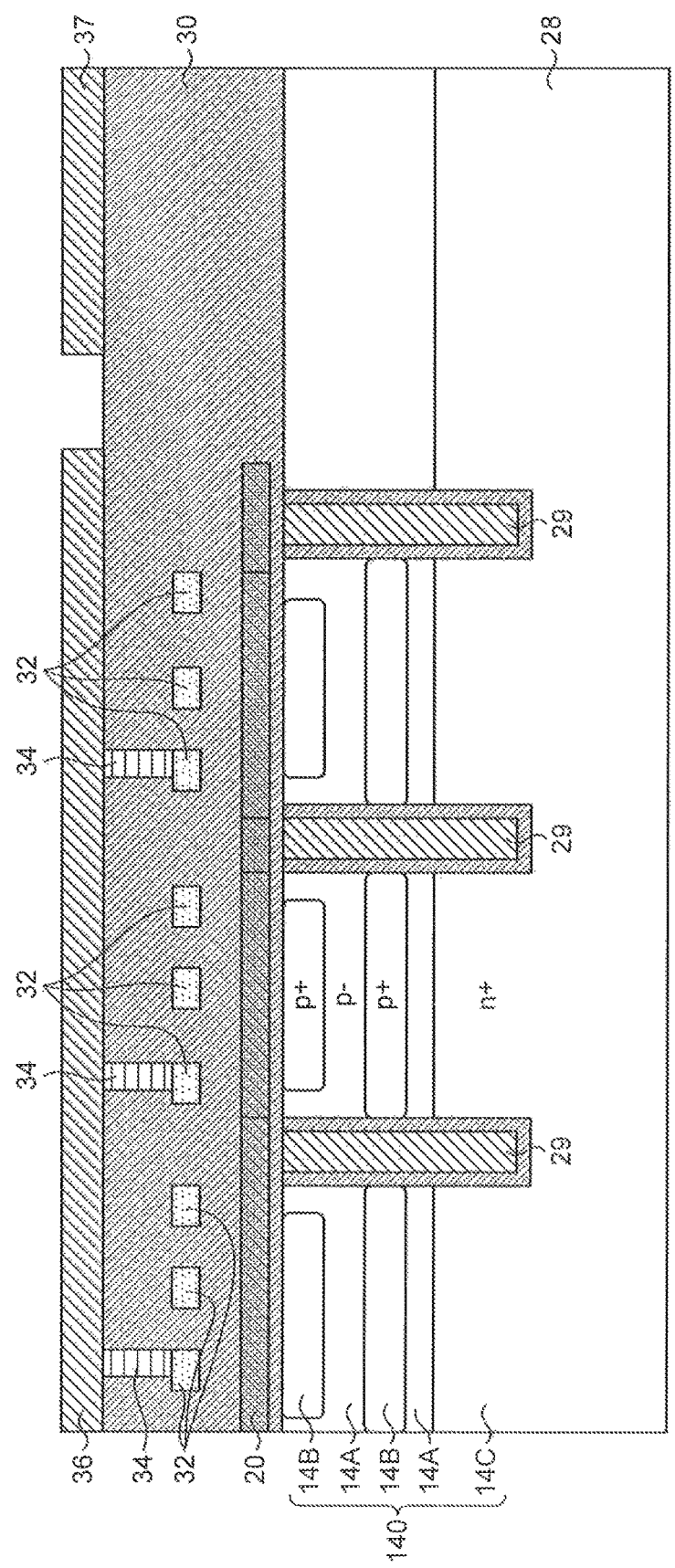
FIG. 14 is an explanatory diagram illustrating the example of the method for manufacturing a photodetector.

Subsequently, as illustrated in FIG. 13, after the insulating layer 30 is formed, quenching resistors 32 connected in series to the first light detection areas 140 are formed. Subsequently, as illustrated in FIG. 14, after the insulating layer 30 is further formed, contact layers 34 are formed. A wiring layer 36 is then formed, and is made to be connected to the quenching resistors 32 via the contact layers 34. Furthermore, an electrode layer 37 is formed.

Figure 15:
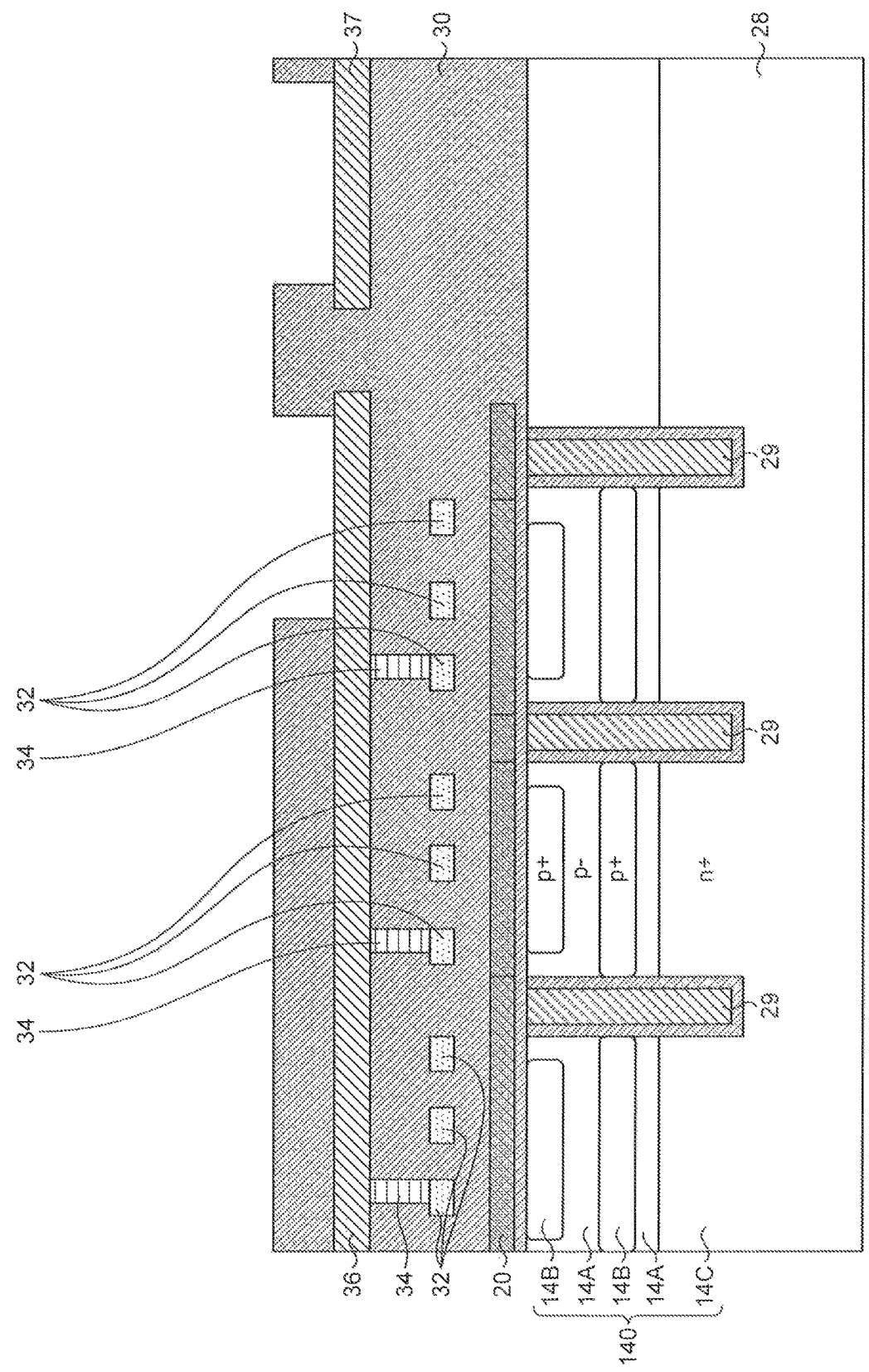
FIG. 15 is an explanatory diagram illustrating the example of the method for manufacturing a photodetector.
Figure 16:
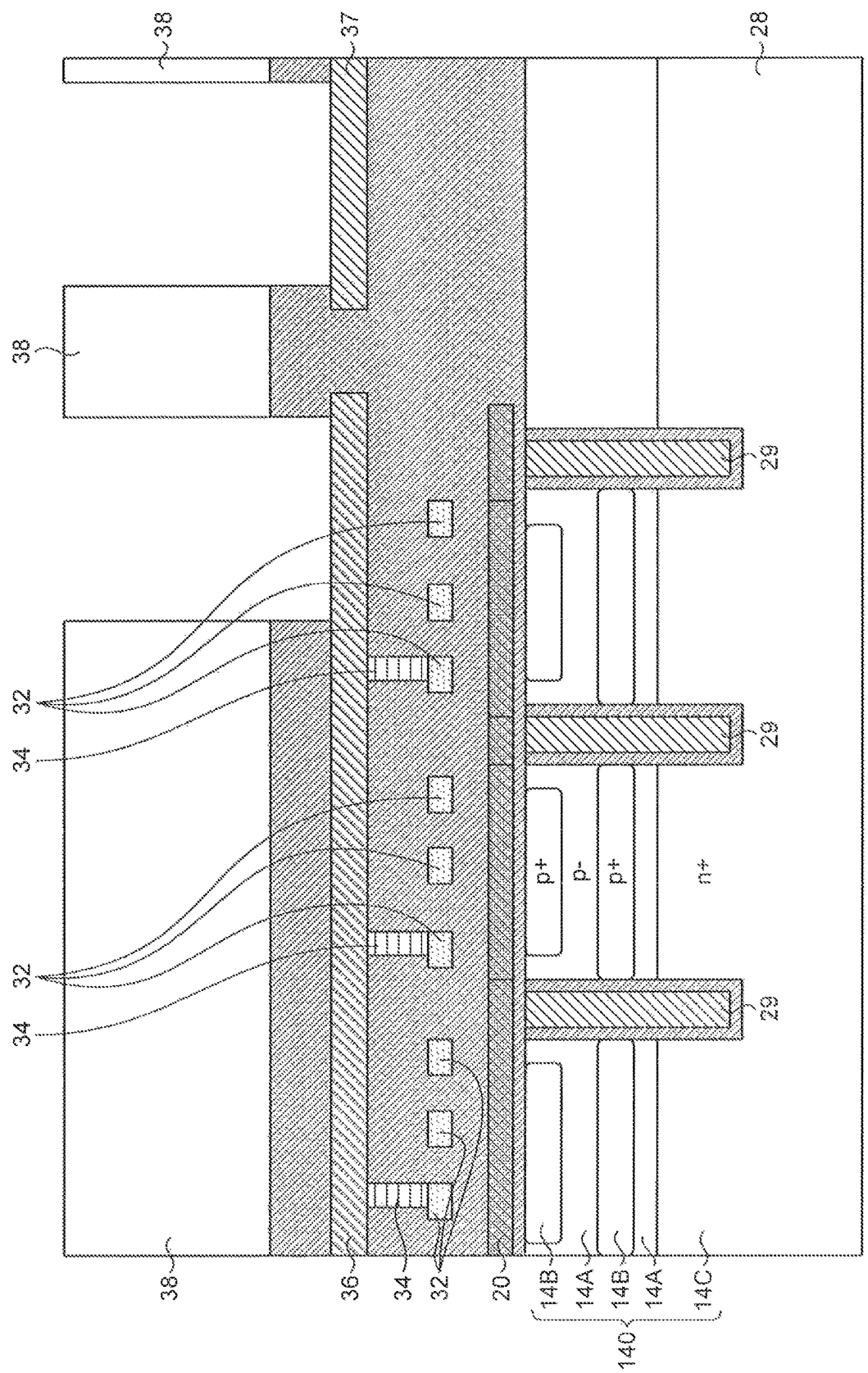
FIG. 16 is an explanatory diagram illustrating the example of the method for manufacturing a photodetector.

Subsequently, as illustrated in FIG. 15, the insulating layer 30 is further formed, and areas for forming via electrodes to be connected to the wiring layer 36 are patterned. Subsequently, a support substrate 33 is formed on the insulating layer 30 (see FIG. 16).

Figure 17:
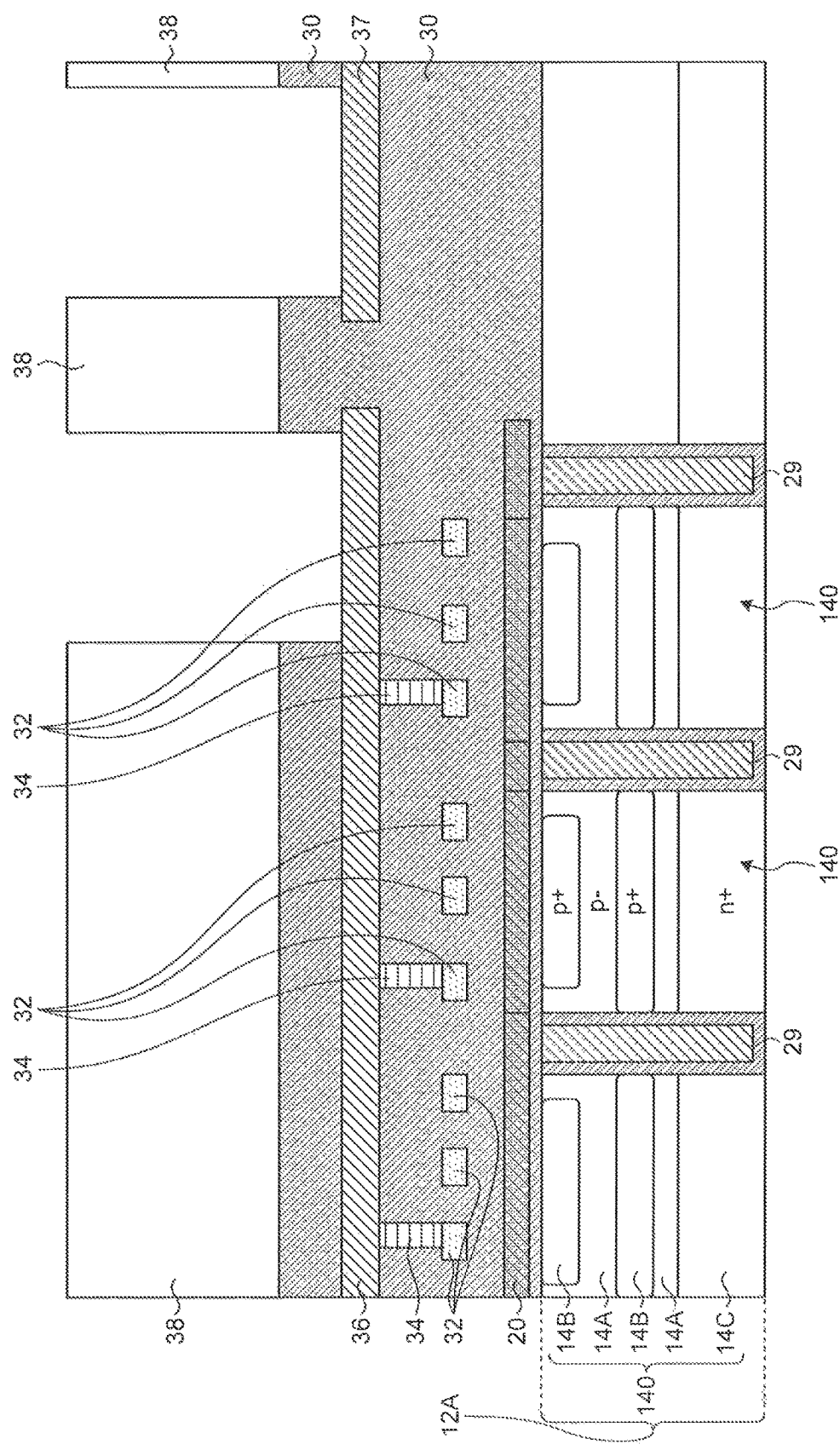
FIG. 17 is an explanatory diagram illustrating the example of the method for manufacturing a photodetector.

On the other hand, the n-type semiconductor substrate 28 is made thinner to obtain a first light detection layer 12A (see FIG. 17).

Figure 18:
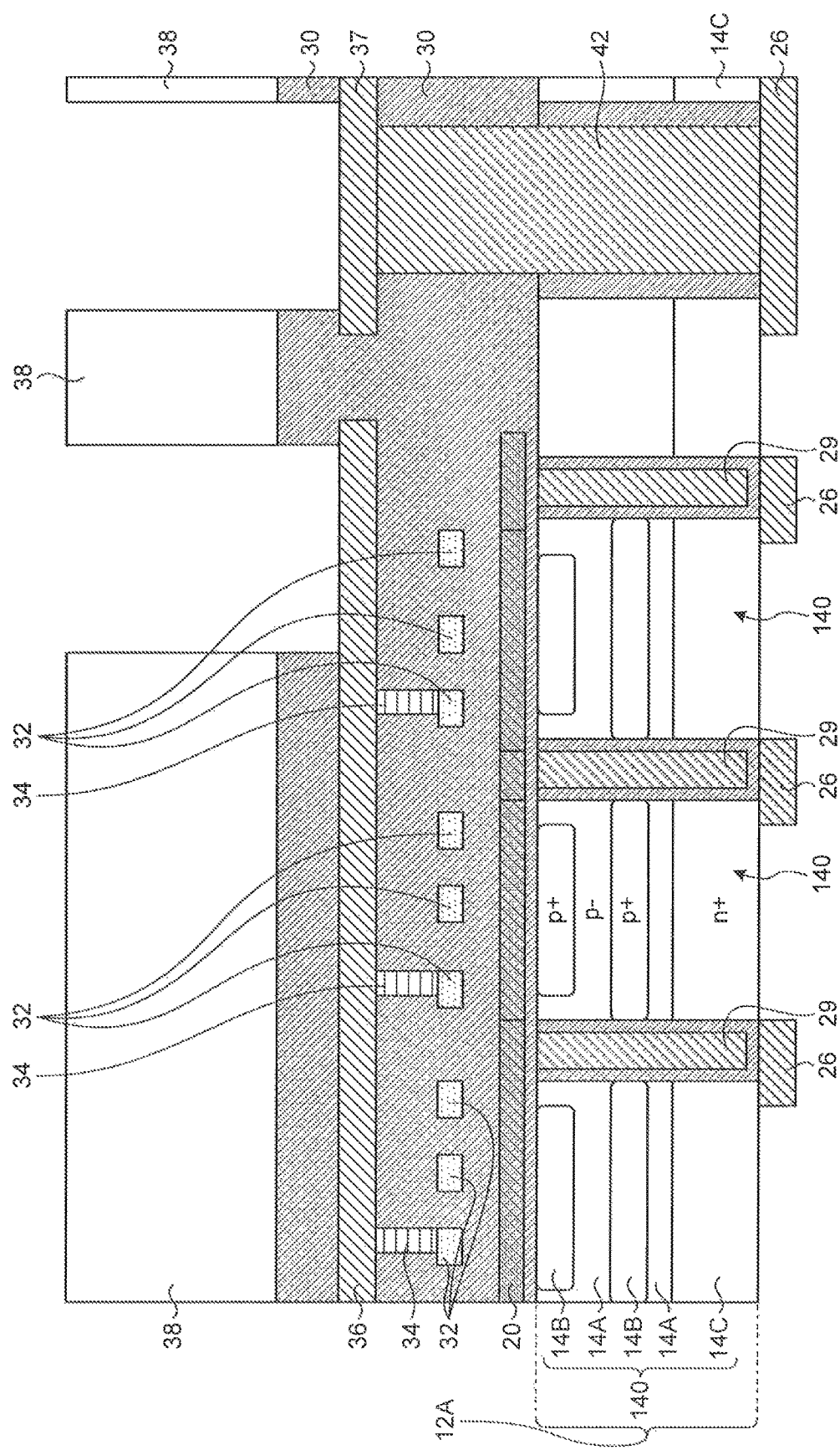
FIG. 18 is an explanatory diagram illustrating the example of the method for manufacturing a photodetector.
Figure 19:
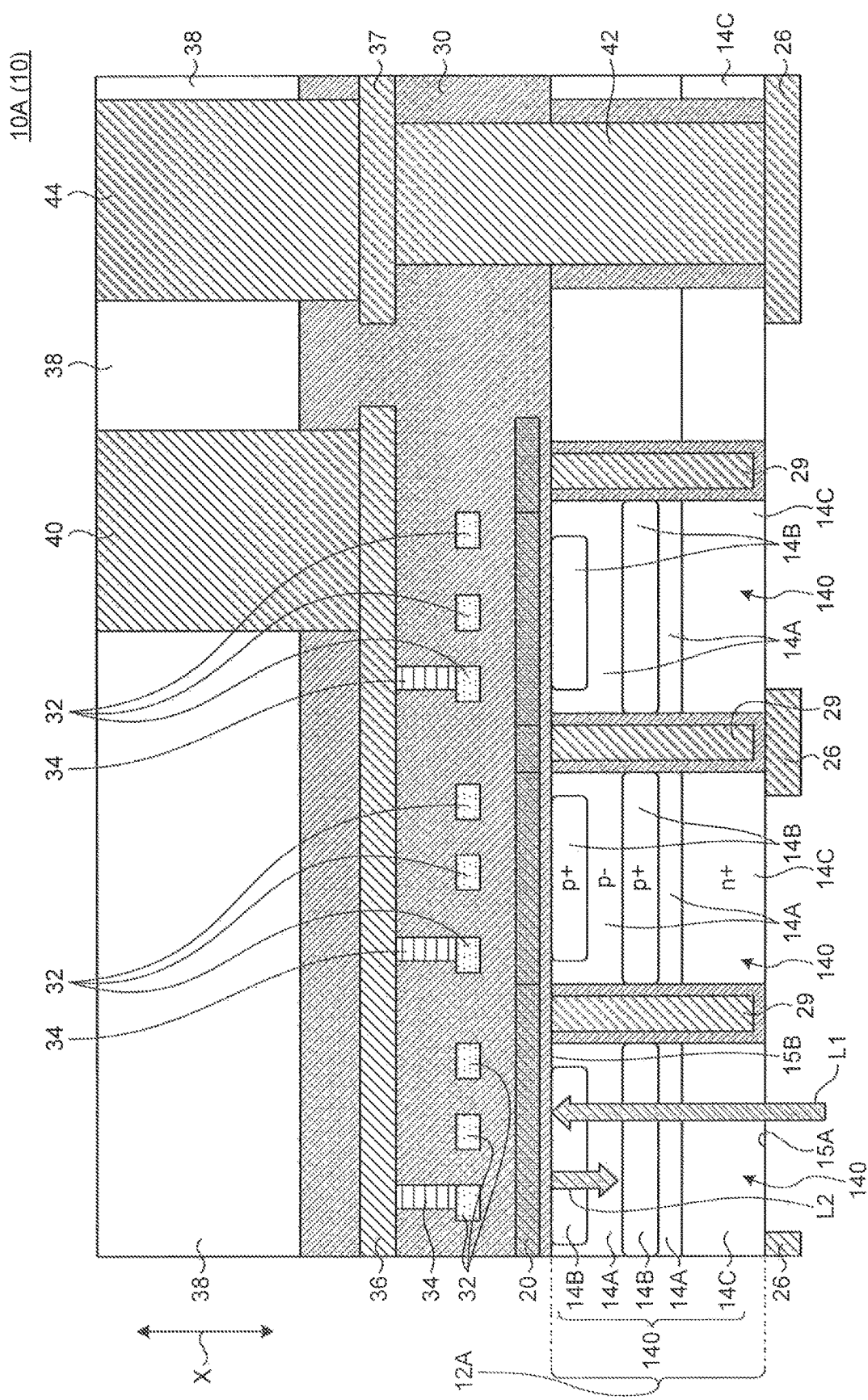
FIG. 19 is an explanatory diagram illustrating the example of the method for manufacturing a photodetector.

Furthermore, as illustrated in FIG. 18, an electrode layer 26 is formed on the first light detection layer 12A on the n-type semiconductor substrate 14C side. Furthermore, the electrode layer 26 is made to be connected to the electrode layer 37 via a via electrode 42. As illustrated in FIG. 19, a via electrode 40 to be connected to the wiring layer 36 and a via electrode 44 to be connected to the electrode layer 37 are then formed, and the photodetector 10A is thus produced.

Sixth Embodiment

FIGS. 20 to 26 are explanatory diagrams illustrating an example of the method for manufacturing the photodetector 10B described in the second embodiment.

Figure 20:
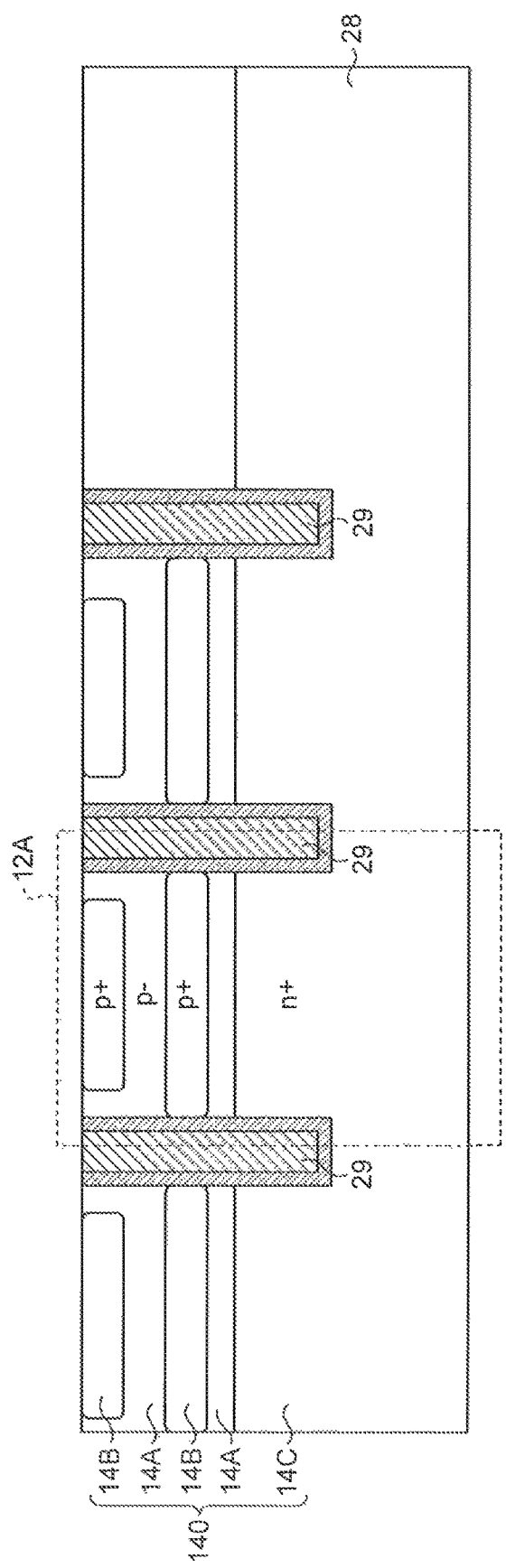
FIG. 20 is an explanatory diagram illustrating an example of a method for manufacturing a photodetector.

As illustrated in FIG. 20, first, an n-type semiconductor substrate 29 is provided. A known semiconductor production process is performed on the n-type semiconductor substrate 28 to form first light detection areas 140. Subsequently, element isolation regions 29 are formed between the first light detection areas 140 (similarly to FIG. 11 of the fifth embodiment).

Figure 21:
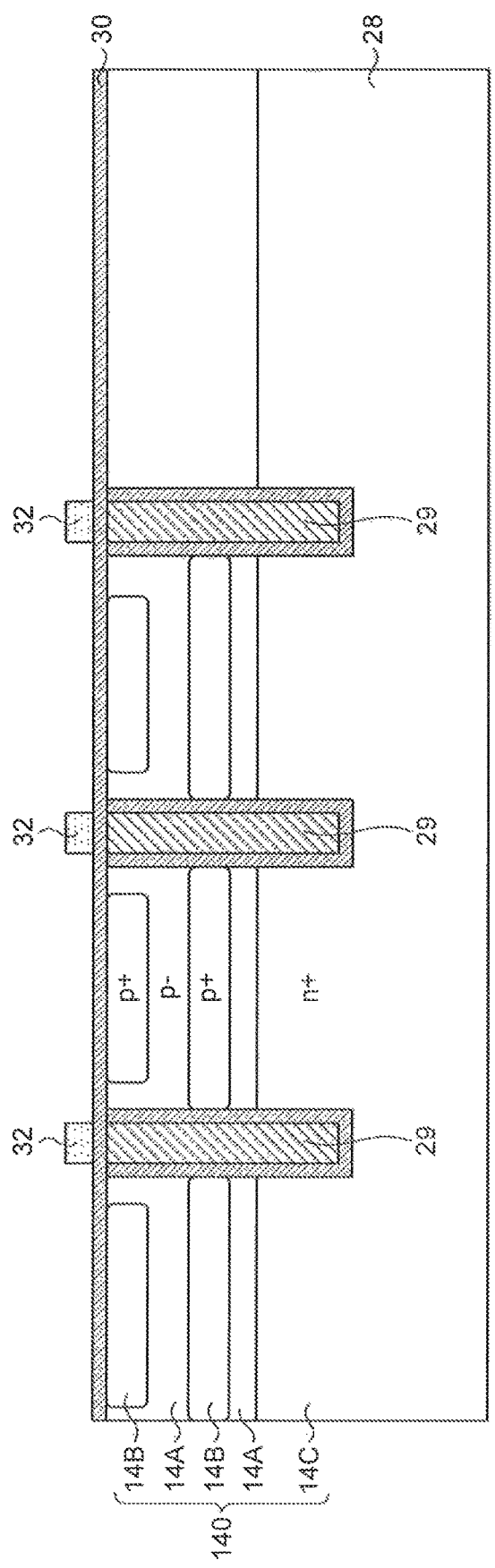
FIG. 21 is an explanatory diagram illustrating the example of the method for manufacturing a photodetector.
Figure 22:
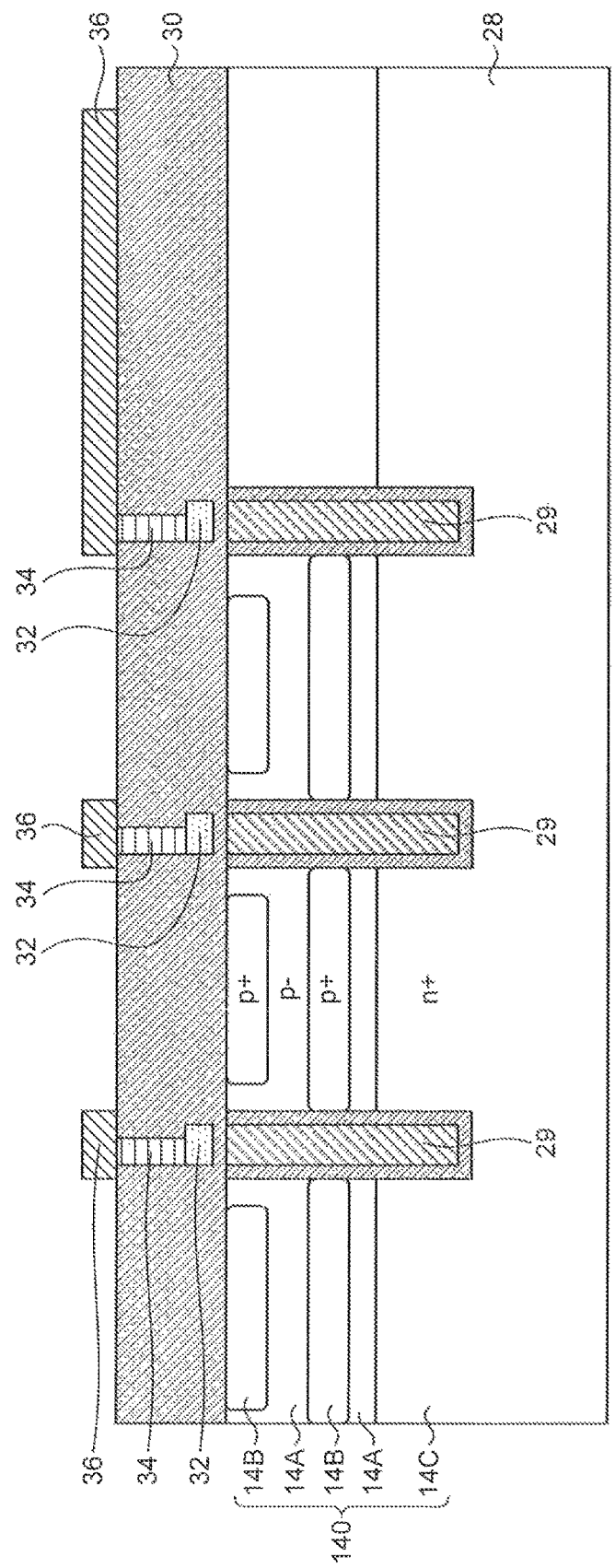
FIG. 22 is an explanatory diagram illustrating the example of the method for manufacturing a photodetector.

Subsequently, as illustrated in FIG. 21, after the insulating layer 30 is formed, quenching resistors 32 connected in series to the first light detection areas 140 are formed. Subsequently, as illustrated in FIG. 22, the insulating layer 30 is further formed, and contact layers 34 are formed. A wiring layer 36 is then formed, and is made to be connected to the quenching resistors 32 via the contact layers 34.

Figure 23:
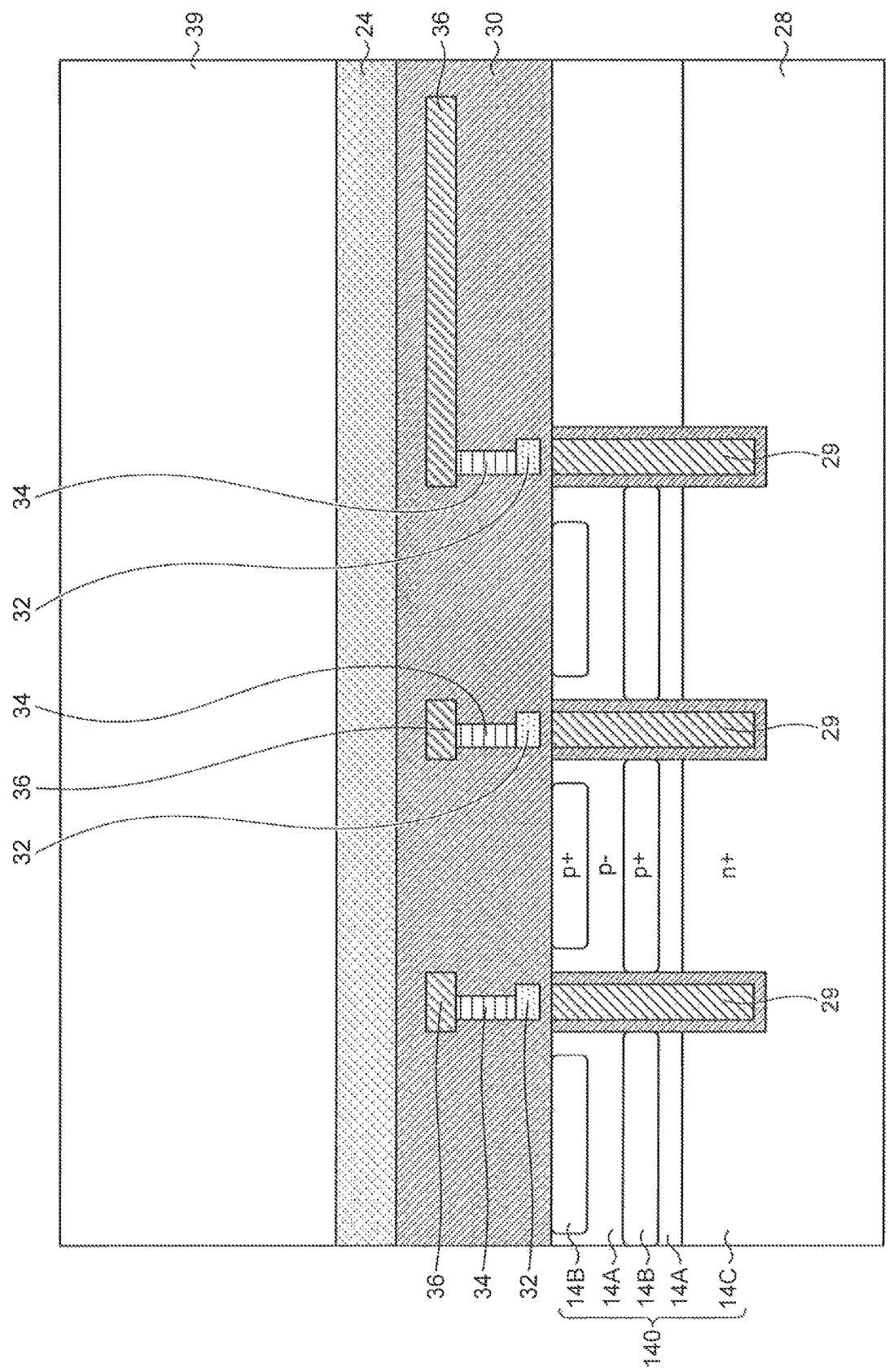
FIG. 23 is an explanatory diagram illustrating the example of the method for manufacturing a photodetector.

Subsequently, as illustrated in FIG. 23, after the insulating layer 30 is further formed, a support substrate 39 is provided via an adhesive layer 24.

Figure 24:
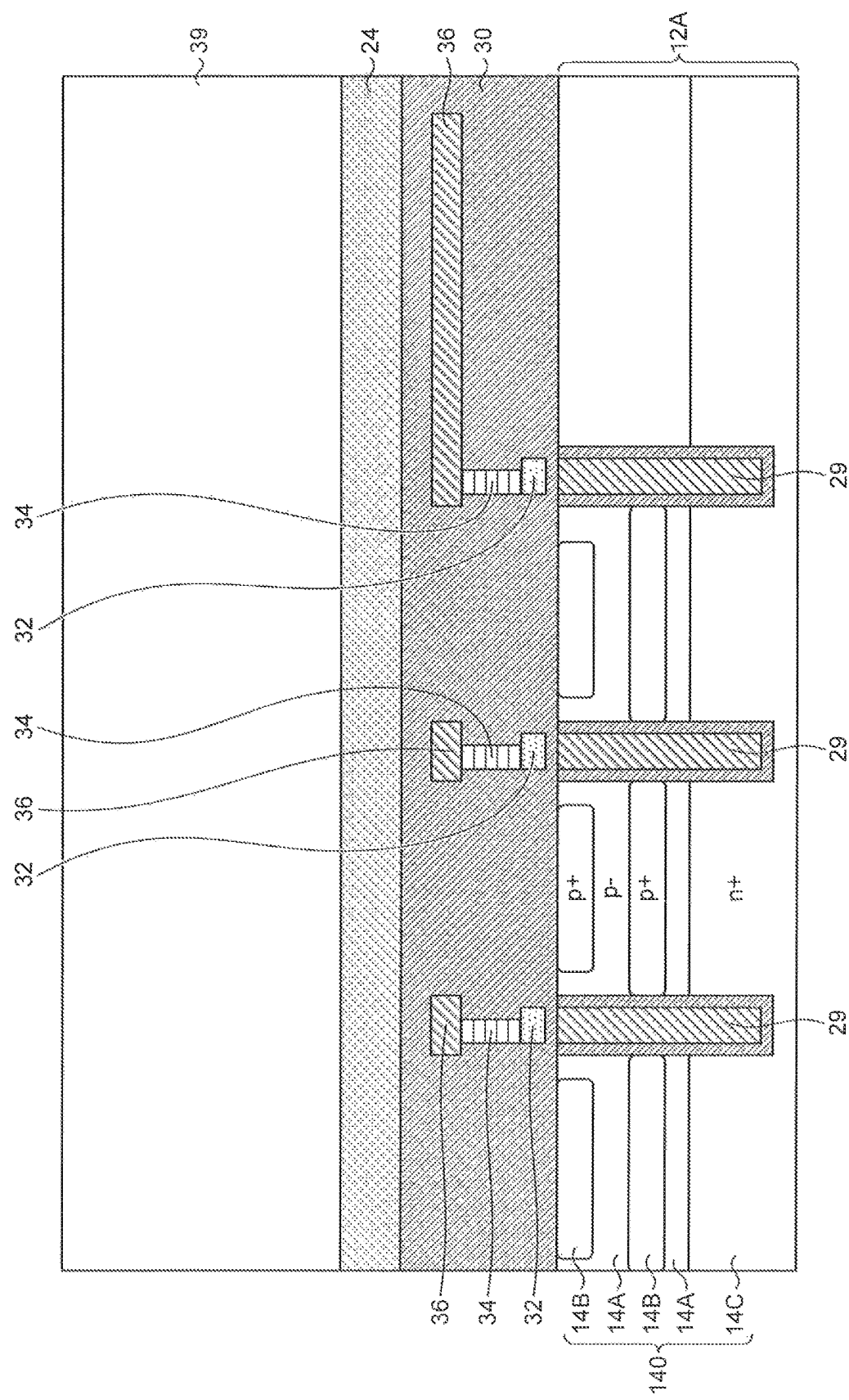
FIG. 24 is an explanatory diagram illustrating an example of the method for manufacturing the photodetector.

On the other hand, the n-type semiconductor substrate 28 is made thinner to obtain a first light detection layer 12A (see FIG. 24).

Figure 25:
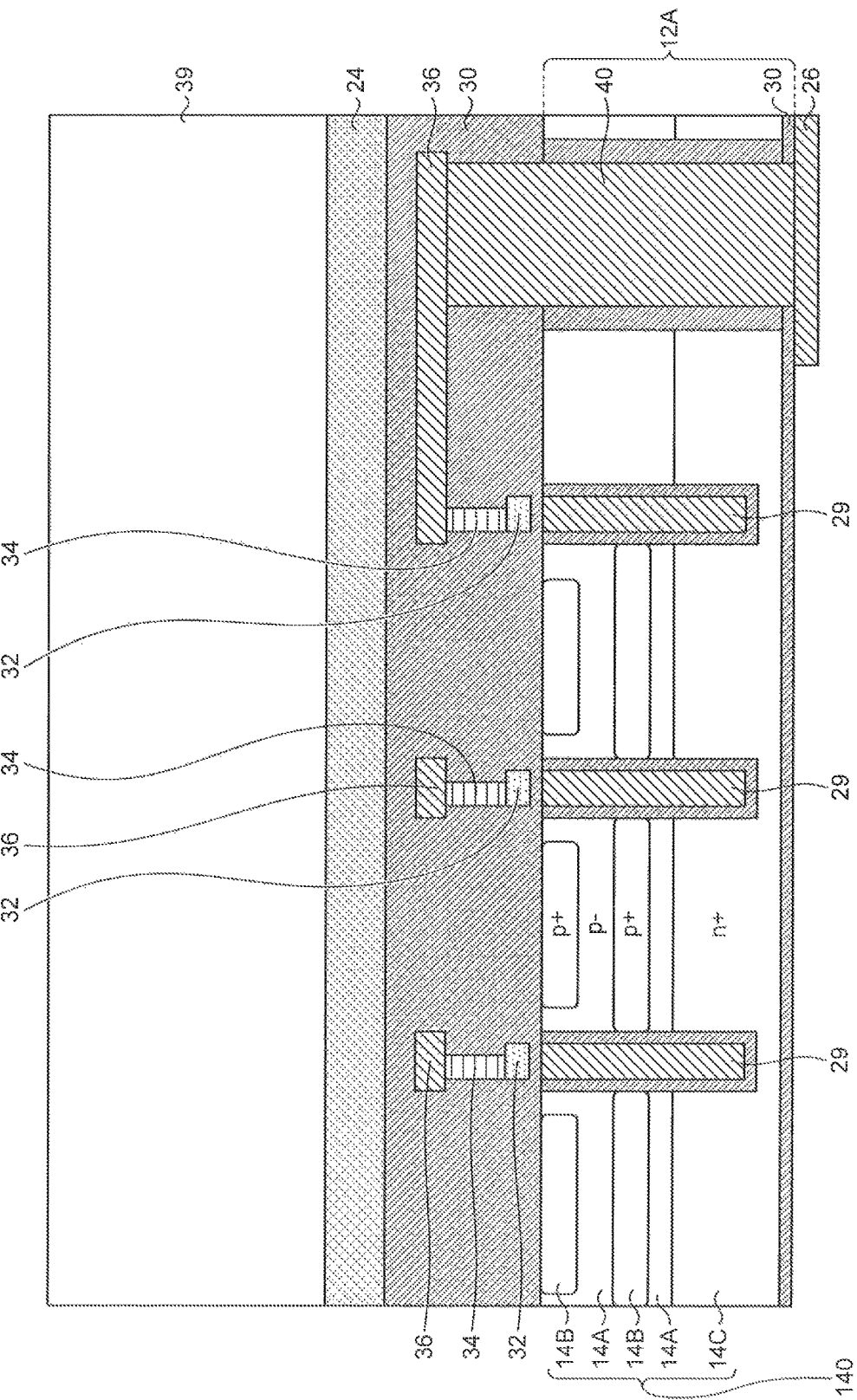
FIG. 25 is an explanatory diagram illustrating an example of the method for manufacturing the photodetector.

Furthermore, as illustrated in FIG. 25, an electrode layer 26 is formed on the first light detection layer 12A on the n-type semiconductor substrate 14C side. Furthermore, the electrode layer 26 is made to be connected to the wiring layer 36 via a via electrode 40.

Figure 26:
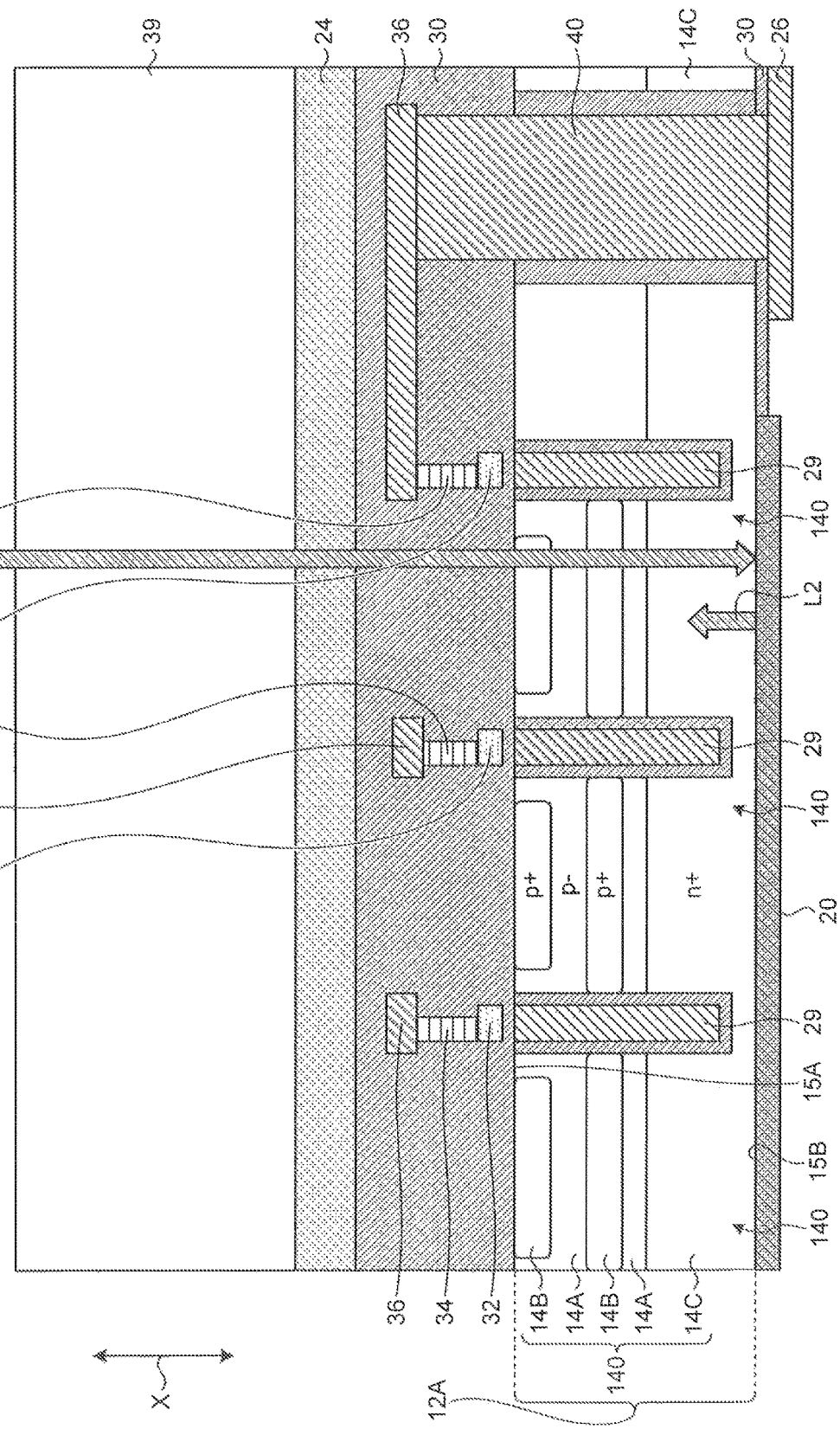
FIG. 26 is an explanatory diagram illustrating the example of the method for manufacturing a photodetector.

Subsequently, as illustrated in FIG. 26, a reflective layer 20 is formed on the second surface 15B side of the first light detection layer 12A. The photodetector 10B is thus produced.

Note that the photodetector 11 in which multiple light detection layers (the first light detection layer 12A and the second light detection layer 12B) are stacked as described in the fourth embodiment may be produced by stacking the photodetectors 10 produced through processes similar to the above with an electrode layer 52, an antireflection layer 54, or the like therebetween. The reflective layer 20 may be disposed at the position described above. The n-type semiconductor substrate 28 may be made thinner after the stacking.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photodetector comprising:
   a first light detection layer having a first surface and a second surface on a side opposite to the first surface, and including a first light detection area including a p-n junction of a p-type semiconductor layer containing Si and an n-type semiconductor layer containing Si;
   a wiring layer connected to the first light detection area;
   a quenching resistor connected to the first light detection area; and
   a reflective layer arranged on a second surface side of the first light detection layer so as to be opposed to the first light detection area, the reflective layer reflecting at least part of light in a wavelength range of 780 nm or longer and 2500 nm or shorter, the reflective layer being arranged without electrical connection to the wiring layer,
   wherein the reflective layer is provided between the first light detection layer and the quenching resistor.

2. The photodetector according to claim 1, wherein the reflective layer is provided between the first light detection layer and the wiring layer.

3. The photodetector according to claim 1, wherein the first surface is a surface of the first light detection area on a p-type semiconductor layer side of the p-n junction or a surface of the first light detection area on an n-type semiconductor layer side of the p-n junction.

4. The photodetector according to claim 1, further comprising
   a second light detection layer having a first surface on which light is incident and a second surface opposite to the first surface, and including a second light detection area including a p-n junction, wherein the first light detection layer and the second light detection layer are stacked in such a manner that the second surface of the first light detection area included in the first light detection layer and the second surface of the second light detection area included in the second light detection layer face the same direction, and
   the second light detection layer is provided between the first light detection layer and the reflective layer.

5. The photodetector according to claim 4, further comprising
   an intermediate layer provided between the first light detection layer and the second light detection layer, wherein
   the intermediate layer transmits at least part of light in a wavelength range to which the first light detection area is sensitive, at least part of light in a wavelength range to which the second light detection area is sensitive, and at least part of light in the wavelength range of 780 nm or longer and 2500 nm or shorter.

6. The photodetector according to claim 4, further comprising
   an antireflection layer provided between layers where a difference in refractive index therebetween is equal to or larger than a threshold among between the first light detection layer and the intermediate layer, between the intermediate layer and the second light detection layer, and between the second light detection layer and the reflective layer, the antireflection layer preventing reflection of at least part of light in a wavelength range to which the first light detection area is sensitive, at least part of light in a wavelength range to which the second light detection area is sensitive, and light in the wavelength range of 780 nm or longer and 2500 nm or shorter.

7. The photodetector according to claim 4, wherein
   when the first light detection area included in the first light detection layer and the second light detection area included in the second light detection layer are projected onto a third surface parallel to the first surface of the first light detection layer, at least part of the first light detection area overlaps with the second light detection area.

8. The photodetector according to claim 4, wherein
   when the first light detection area included in the first light detection layer and the second light detection area included in the second light detection layer are projected onto a third surface parallel to the first surface of the first light detection layer, at least part of the first light detection area does not overlap with the second light detection area.

9. The photodetector according to claim 4, wherein
   the second light detection area, which is positioned closer to the reflective layer among the first light detection area included in the first light detection layer and the second light detection area included in the second light detection layer, has a thickness larger than that of the first light detection area.

* * * * *